US010126660B2

(12) United States Patent
Kandaka et al.

(10) Patent No.: US 10,126,660 B2
(45) Date of Patent: Nov. 13, 2018

(54) MULTILAYER FILM REFLECTOR, METHOD OF MANUFACTURING MULTILAYER FILM REFLECTOR, PROJECTION OPTICAL SYSTEM, EXPOSURE APPARATUS, AND METHOD OF MANUFACTURING DEVICE

(71) Applicant: NIKON CORPORATION, Tokyo (JP)

(72) Inventors: Noriaki Kandaka, Sagamihara (JP); Katsuhiko Murakami, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 63 days.

(21) Appl. No.: 14/988,141

(22) Filed: Jan. 5, 2016

(65) Prior Publication Data

US 2016/0246178 A1 Aug. 25, 2016

Related U.S. Application Data

(63) Continuation of application No. PCT/JP2014/003551, filed on Jul. 3, 2014.

(30) Foreign Application Priority Data

Jul. 5, 2013 (JP) .................................. 2013-141741

(51) Int. Cl.
*G03B 27/54* (2006.01)
*G03F 7/20* (2006.01)
(Continued)

(52) U.S. Cl.
CPC ........... *G03F 7/702* (2013.01); *G02B 5/0816* (2013.01); *G02B 5/0891* (2013.01);
(Continued)

(58) Field of Classification Search
CPC .... G02B 5/0816; G02B 5/0891; G21K 1/062; G03F 7/702; G03F 7/70316; G03F 7/70958
(Continued)

(56) References Cited

U.S. PATENT DOCUMENTS 4,969,175 A 11/1990 Nelson et al.
6,208,407 B1 3/2001 Loopstra
(Continued)

FOREIGN PATENT DOCUMENTS

JP 2005-26396 1/2005
JP 2007-109964 4/2007
(Continued)

OTHER PUBLICATIONS

Machine translation and English abstract of JP 2007-109964, Apr. 26, 2007.*
(Continued)

*Primary Examiner* — Peter B Kim
(74) *Attorney, Agent, or Firm* — Finnegan, Henderson, Farabow, Garrett & Dunner LLP

(57) ABSTRACT

A multilayer film reflector is a multilayer film reflector that includes a first uniform period multilayer film, an adjustment layer, and a second uniform period multilayer film in this order from a substrate side. A combination of the following (a) to (c) is set to each region or each position within a reflection surface. (a) Reflection characteristics of the single first uniform period multilayer film, (b) reflection characteristics of the single second uniform period multilayer film, and (c) a film thickness of the adjustment layer.

22 Claims, 25 Drawing Sheets

(51) Int. Cl.
  *G02B 5/08* (2006.01)
  *G21K 1/06* (2006.01)
(52) U.S. Cl.
  CPC ...... *G03F 7/70316* (2013.01); *G03F 7/70958* (2013.01); *G21K 1/062* (2013.01)
(58) Field of Classification Search
  USPC .......................................................... 355/67
  See application file for complete search history.

(56) References Cited

U.S. PATENT DOCUMENTS

| | | | |
|---|---|---|---|
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,452,661 | B1 | 9/2002 | Komatsuda |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,897,963 | B1 | 5/2005 | Taniguchi et al. |
| 2005/0031071 | A1 | 2/2005 | Kanazawa et al. |
| 2005/0157384 | A1 | 7/2005 | Shiraishi et al. |
| 2007/0081229 | A1 | 4/2007 | Shiraishi |
| 2007/0091421 | A1 | 4/2007 | Hosoya et al. |
| 2008/0049307 | A1 | 2/2008 | Kandaka et al. |
| 2008/0259439 | A1* | 10/2008 | Shiraishi ................ B82Y 10/00 359/360 |
| 2011/0228245 | A1 | 9/2011 | Mann |
| 2012/0314281 | A1 | 12/2012 | Von Blanckenhagen |
| 2014/0072106 | A1 | 3/2014 | Conley et al. |
| 2014/0078481 | A1 | 3/2014 | Mueller et al. |

FOREIGN PATENT DOCUMENTS

| | | |
|---|---|---|
| JP | 2007-109971 | 4/2007 |
| JP | 2007-140105 | 6/2007 |
| JP | 2011-228699 | 11/2011 |
| JP | 2012-503318 | 2/2012 |
| WO | WO 2011/142782 A2 | 11/2011 |
| WO | WO 2012/123240 A1 | 9/2012 |

OTHER PUBLICATIONS

International Search Report issued by the Japanese Patent Office in International Application No. PCT/JP2014/003551, dated Oct. 14, 2014 (2 pages).

Notification Concerning Transmittal of International Preliminary Report on Patentability, International Preliminary Report on Patentability, and Written Opinion of the International Searching Authority, issued in International Application No. PCT/JP2014/003551 by the International Bureau of WIPO, dated Jan. 14, 2016 (15 pages).

Office Action issued by the Japanese Patent Office in counterpart foreign Application No. 2015-525058 dated Sep. 20, 2016, and English translation thereof.

Notice of Preliminary Rejection issued by the Korean Intellectual Property Office dated May 18, 2017 in counterpart Korean Application No. 9-5-2017-034655579, and English translation thereof.

Extended European Search Report issued by the European Patent Office in counterpart European Application No. 14819872.4, dated Mar. 29, 2017 (10 pages).

Office Action issued by the Korean Intellectual Property Office dated Nov. 30, 2017 in counterpart Korean Application No. 10-2016-7003246, and English translation thereof.

\* cited by examiner

Fig.3

| ↑Substrate Side | | | A-1 | A-2 | A-3 | A-4 | A-5 |
|---|---|---|---|---|---|---|---|
| 4 Layer Pair | Block A | Mo | 3.371 | 1.800 | 0.600 | 0.100 | 0.100 |
| | | Si | 4.200 | 5.600 | 6.800 | 7.300 | 7.300 |
| Spacer 1 | | Si | 3.670 | 3.300 | 3.000 | 2.700 | 2.400 |
| 9 Layer Pair | Block B | Mo | 3.371 | 2.490 | 1.630 | 0.790 | 0.100 |
| | | Si | 4.200 | 5.000 | 5.800 | 6.600 | 7.300 |
| Spacer 2 | | Si | 3.670 | 3.250 | 2.800 | 2.300 | 1.800 |
| 20 Layer Pair | Block C | Mo | 3.371 | 3.371 | 3.371 | 3.371 | 3.371 |
| | | Si | 4.200 | 4.200 | 4.200 | 4.200 | 4.200 |

↓Surface Side

| ↑Substrate Side | | | B-1 | B-2 | B-3 | B-4 | B-5 |
|---|---|---|---|---|---|---|---|
| 4 Layer Pair | Block A | Mo | 3.228 | 1.724 | 0.575 | 0.100 | 0.100 |
| | | Si | 4.022 | 5.363 | 6.512 | 6.990 | 6.990 |
| | Spacer 1 | Si | 3.550 | 3.192 | 2.902 | 2.612 | 2.322 |
| 9 Layer Pair | Block B | Mo | 3.228 | 2.384 | 1.561 | 0.757 | 0.100 |
| | | Si | 4.022 | 4.788 | 5.554 | 6.320 | 6.990 |
| | Spacer 2 | Si | 3.550 | 3.144 | 2.708 | 2.225 | 1.741 |
| 20 Layer Pair | Block C | Mo | 3.228 | 3.228 | 3.228 | 3.228 | 3.228 |
| | | Si | 4.022 | 4.022 | 4.022 | 4.022 | 4.022 |
| ↓Surface Side | | | | | | | |

Fig.9

Substrate Side ↑

| | A | B | C | D | E | F | G | H | I | J | K | L | M | N | O | P | Q |
|---|---|---|---|---|---|---|---|---|---|---|---|---|---|---|---|---|---|
| Fourth Block | 2 | 2 | 1 | 1 | 1 | 0 | 0 | 0 | 0 | 0 | 0 | 0 | 0 | 0 | 0 | 0 | 0 |
| Third Block | 6 | 5 | 5 | 4 | 3 | 3 | 2 | 1 | 1 | 0 | 0 | 0 | 0 | 0 | 0 | 0 | 0 |
| Second Block | 8 | 8 | 8 | 8 | 8 | 8 | 8 | 8 | 7 | 7 | 6 | 5 | 4 | 3 | 2 | 1 | 0 |
| First Block | 18 | 19 | 20 | 21 | 22 | 23 | 24 | 25 | 26 | 27 | 28 | 29 | 30 | 31 | 32 | 33 | 34 |

↓ Surface Side

Without Mask Shift

With Mask Shift

MULTILAYER FILM REFLECTOR, METHOD OF MANUFACTURING MULTILAYER FILM REFLECTOR, PROJECTION OPTICAL SYSTEM, EXPOSURE APPARATUS, AND METHOD OF MANUFACTURING DEVICE

CROSS REFERENCE TO THE RELATED APPLICATIONS

This application is a continuation application of International Application PCT/JP2014/003551, filed Jul. 3, 2014, designating the U.S., and claims the benefit of priority from Japanese Patent Application No. 2013-141741, filed on Jul. 5, 2013, the entire contents of which are incorporated herein by reference.

BACKGROUND

1. Field

The present application relates to a multilayer film reflector, a method of manufacturing a multilayer film reflector, a projection optical system, an exposure apparatus, and a method of manufacturing a device.

2. Description of the Related Art

For example, an EUV exposure apparatus disclosed in Patent Document 1: U.S. Patent Application Publication No. 2005/157384 has been suggested as an exposure apparatus used in a photolithography process. A multilayer film reflector capable of reflecting extreme ultra-violet (EUV) light has been used in a projection optical system of the EUV exposure apparatus.

A uniform period multilayer film which is the most general multilayer film has a simple configuration in which two layers (a layer pair) having different refractive indices are laminated with a uniform period. In order to increase NA of the projection optical system, it is necessary to reflect EUV light having a wide angle range. Meanwhile, in the uniform period multilayer film having the simple configuration, it is difficult to increase a reflection angle range of the EUV light.

In contrast, in a non-uniform period multilayer film, since film thicknesses of all layers are arbitrarily determined, it is possible to obtain a substantially constant reflectivity in a wide angle range. However, in the non-uniform period multilayer film, since the number of adjustment parameters at the time of film deposition is also increased as the number of design parameters is increased, time and labor are required until reflection characteristics as designed are achieved.

In view of such circumstances, it is a proposition to provide a high-functional multilayer film reflector with a simple configuration, a method of manufacturing the multilayer film reflector, a projection optical system using the multilayer film reflector, an exposure apparatus using the projection optical system, and a method of manufacturing a high-functional device.

SUMMARY

An example of a multilayer film reflector of the present invention is a multilayer film reflector that includes a first uniform period multilayer film, an adjustment layer, and a second uniform period multilayer film in sequence from a substrate side. A combination of the following (a) to (c) is set to each position or each region within a reflection surface:
(a) reflection characteristics of the single first uniform period multilayer film,
(b) reflection characteristics of the single second uniform period multilayer film, and
(c) a film thickness of the adjustment layer.

An example of a method of manufacturing the multilayer film reflector of the present invention is a method of manufacturing the example of the multilayer film reflector of the present invention. The manufacturing method includes: releasing particles as a material of a layer of the multilayer film reflector toward a film deposition region; relatively moving the substrate of the multilayer film reflector and the film deposition region; and controlling a film thickness distribution of the layer formed on the substrate by controlling at least one of a size of the film deposition region in the movement direction and a velocity of the movement.

Another example of the method of manufacturing the multilayer film reflector of the present invention is a method of manufacturing the example of the multilayer film reflector of the present invention. The manufacturing method includes: releasing particles as a material of a layer of the multilayer film reflector toward the substrate of the multilayer film reflector; and controlling a film thickness distribution of the layer formed on the substrate by distinguishably using a plurality of masks having different aperture patterns as masks to be set in a path of the particles.

An example of a projection optical system of the present invention includes the example of the multilayer film reflector of the present invention.

An example of an exposure apparatus of the present invention includes an example of a projection optical system of the present invention.

An example of a method of manufacturing a device of the present invention uses the example of the exposure apparatus of the present invention.

BRIEF DESCRIPTION OF THE DRAWINGS

FIG. 3 is a configuration example of representative reflection points A-1 to A-5 according to the first embodiment.

FIG. 9 is a configuration example of the representative reflection points A to Q according to the second embodiment.

DETAILED DESCRIPTION OF THE EMBODIMENTS

First Embodiment

Hereinafter, an embodiment of a multilayer film reflector will be described as a first embodiment of the present invention. Here, it is assumed that the multilayer film reflector of the present embodiment is applied to a projection optical system of an EUV exposure apparatus.

Initially, the multilayer film reflector applied to the projection optical system of the EUV exposure apparatus needs to have a high reflectivity. This is because it is necessary to improve the transmissivity of the projection optical system in order to improve the throughput of the EUV exposure apparatus. Since a Mo/Si uniform period multilayer film reflector of the related art has a high reflectivity in a EUV wavelength band but has about a reflectivity of 65% to 70%, in a case where 10 sheets of multilayer film reflectors are applied to the projection optical system, the transmissivity of the entire projection optical system is about 1 to 2%. Thus, if the reflectivity of the multilayer film reflector is increased by, for example, 1%, the transmissivity of the projection optical system is increased by 10%.

The multilayer film reflector applied to the projection optical system of the EUV exposure apparatus needs to reflect incident light having a wide angle range at a uniform reflectivity. This is because if the number of apertures (NA) of the projection optical system is increased in order to improve resolution, an angle range of light to be reflected by each multilayer film reflector is widened. The Mo/Si uniform period multilayer film reflector of the related art has difficulty obtaining a uniform reflectivity in a wide angle range with respect to light having a wavelength of about 13.5 nm.

Here, even in the multilayer film reflector applied to the projection optical system of the EUV exposure apparatus, a film design parameter needs to be suppressed. Incidentally, in the non-uniform period multilayer film of the related art, since film thicknesses of all the layers are arbitrarily determined, it is possible to widen the angle range capable of reflecting EUV light with a high reflectivity. However, in the non-uniform period multilayer film, since as the number of design parameters is increased, the number of adjustment parameters at the time of film deposition is increased, enormous time and labor are required until reflectivity characteristics are obtained.

Thus, a simple film configuration having the uniform period multilayer film as a basic configuration is adopted as a reflection film of the multilayer film reflector of the present embodiment.

Figure 1:
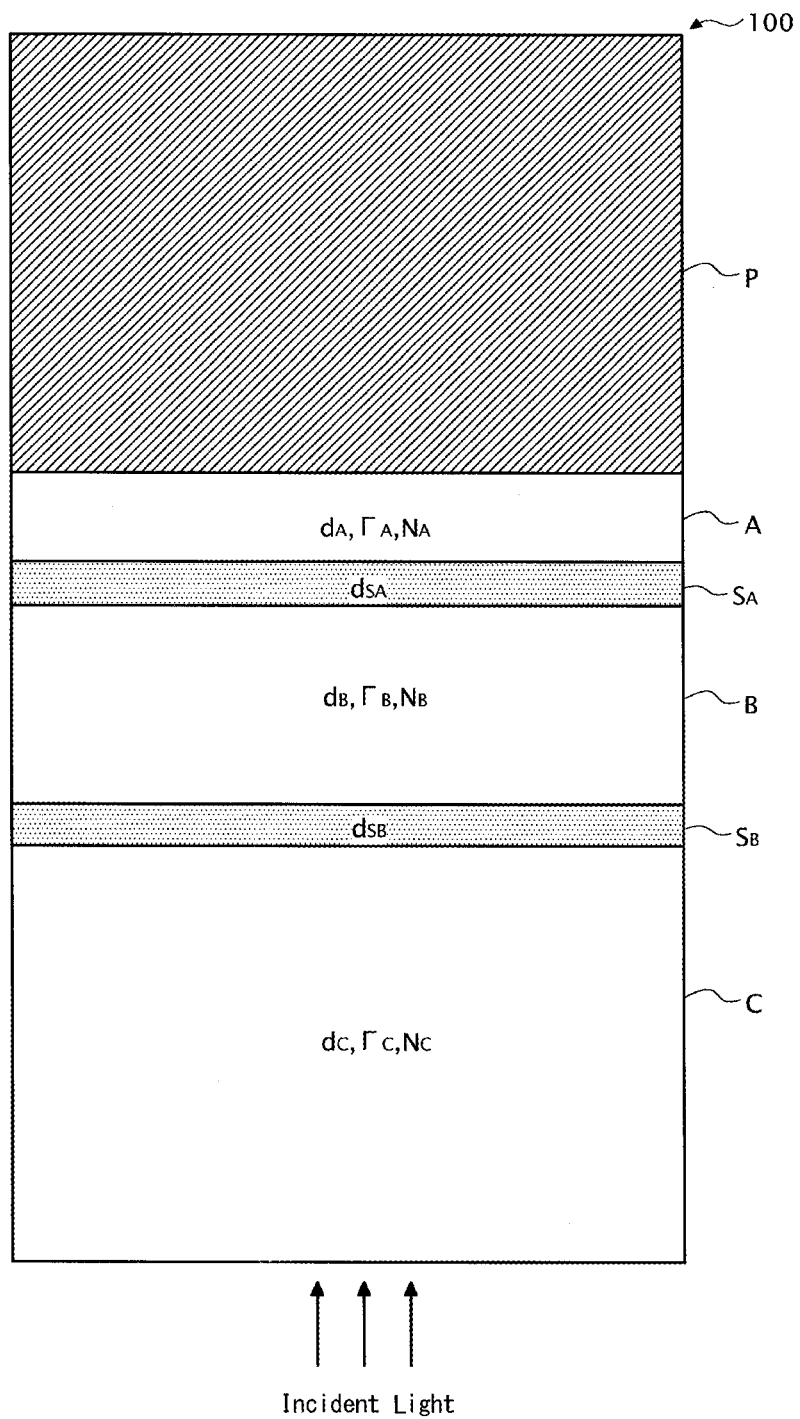
FIG. 1 is a schematic diagram for describing a basic configuration of a multilayer film reflector according to a first embodiment.

As shown in FIG. 1, a multilayer film reflector 100 of the present embodiment is basically obtained by sequentially forming a plurality of blocks A, B, . . . which is formed from the uniform period multilayer film on an optical substrate P which is a reflector substrate, and spacer layers $S_A$, $S_B$, . . . are interposed between the blocks which are adjacent to each other.

In the present embodiment, the number of blocks is "3" as shown in FIG. 1. That is, on the substrate P, the block A formed from the uniform period multilayer film, the block B formed from the uniform period multilayer film, and the block C formed from the uniform period multilayer film are sequentially formed. The spacer $S_A$ is interposed between the blocks A and B adjacent to each other, and the spacer $S_B$ is interposed between the block B and C adjacent to each other.

The multilayer film reflector 100 reflects incident light from an anti-substrate side (surface side) of the block C. In the present embodiment, it is assumed that the incident light is EUV light having a wavelength of about 11 nm to 14 nm (soft X-ray region). That is, in the present embodiment, it is assumed that a use wavelength of the multilayer film reflector 100 is about 11 nm to 14 nm.

The use wavelength of the multilayer film reflector 100 is not limited to the aforementioned example, but may be about 5 to 50 nm, may be about 5 to 20 nm, may be 193 nm or less, or may be a wavelength of vacuum ultraviolet light (VUV light), such as 193 nm which is a wavelength of an ArF excimer laser, or 157 nm which is a wavelength of a F2 laser.

Hereinafter, each block and each spacer layer will be described in detail.

Initially, the substrate P of the multilayer film reflector 100 is formed using, for example, an ultralow-expansion glass. As such a substrate P, for example, ULE produced by Corning Incorporated or Zerodur (registered trademark) produced by Schott AG are applicable.

The block A is a uniform period multilayer film block obtained by laminating layer pairs which have different refractive indices and have a ratio of film thickness $\Gamma_A$ at a cycle length $d_A$ by $N_A$ times. One layer of a unit structure (that is, a layer pair) of the block A is formed using a material having a large difference between a refractive index with respect to the incident light and a refractive index in vacuum, and the other layer of the layer pair is formed using a material having a small difference between the refractive index with respect to the incident light and the refractive index in vacuum. Here, the one layer (heavy atom layer) of the layer pair is a molybdenum layer (Mo layer), and the other layer (light atom layer) is a silicon layer (Si layer).

A refractive index n in vacuum is 1, a refractive index $n_{Mo}$ of the Mo layer with respect to the EUV light having a wavelength of 13.5 nm is 0.92, and a refractive index $n_{Si}$ of the Si layer with respect to the EUV light having a wavelength of 13.5 nm is 0.998.

A cycle length $d_A$ of the layer pair in the block A is represented by the sum of a film thickness of the Mo layer of the layer pair and a film thickness of the Si layer, the ratio of film thickness $\Gamma_A$ of the layer pair in the block A is a ratio of film thickness of the Mo layer in the cycle length $d_A$, and the number of laminations $N_A$ of the layer pair in the block A is the total number of layer pairs in the block A. Hereinafter, the cycle length $d_A$ of the layer pair in the block A is referred to as a "pair cycle length $d_A$", the ratio of film thickness $\Gamma_A$ of the layer pair in the block A is referred to as a "pair ratio $\Gamma_A$", and the number of laminations $N_A$ of the layer pair in the block A is referred to as a "pair number $N_A$".

The spacer layer $S_A$ is an adjustment layer having a film thickness $d_{SA}$ for adjusting the contribution of the block A with respect to the incident light.

An extinction coefficient of the spacer layer $S_A$ with respect to the incident light is less than an extinction coefficient (specifically, an extinction coefficient of a material having a greatest extinction coefficient in the block A) of the block A with respect to the incident light. For example, such a spacer layer $S_A$ may be a layer which is made of any one material of C, B, Si, Zr, Nb, Ru and Mo, or may be a mixture layer including at least one material of C, B, Si, Zr, Nb, Ru and Mo. A material of the spacer layer $S_A$ needs to be a material having a small extinction coefficient with respect to the incident light, if possible. Hereinafter, it is assumed that the spacer $S_A$ is a Si layer. If the spacer layer $S_A$ is a Si layer, it is efficient because a part of the material of the block A can be commonly used to deposit the spacer layer $S_A$.

The block B is a uniform period multilayer film block obtained by laminating layer pairs which have different refractive indices and have a ratio of film thickness $\Gamma_B$ at a cycle length $d_B$ by $N_B$ times. A unit structure (that is, a layer pair) of the block B is the same (here, Mo layer or Si layer) as the layer pair of the block A.

The cycle length $d_B$ of the layer pair in the block B is represented by the sum of the film thickness of the Mo layer and the film thickness of the Si layer of the layer pair, the ratio of film thickness $\Gamma_B$ of the layer pair in the block B is a ratio of the film thickness of the Mo layer at the cycle length $d_B$, the number of laminations NB of the layer pair in the block B is the total number of layer pairs in the block B. Hereinafter, the cycle length dB of the layer pair in the block B is referred to as a "pair cycle length $d_B$", the ratio of film thickness $\Gamma_B$ of the layer pair in the block B is referred to as a "pair ratio $\Gamma_B$", and the number of laminations NB of the layer pair in the block B is referred to as a "pair number $N_B$".

The spacer layer $S_B$ is an adjustment layer of the film thickness $d_{SB}$ for adjusting the contribution of the block B with respect to the incident light.

An extinction coefficient of the spacer layer $S_B$ with respect to the incident light is less than an extinction coefficient (specifically, an extinction coefficient of the material having the greatest extinction coefficient in the block B) of the block B with respect to the incident light. For example, such a spacer layer $S_B$ may be a layer which is made of any one material of C, B, Si, Zr, Nb, Ru and Mo, or may be a mixture layer including at least one material of C, B, Si, Zr, Nb, Ru and Mo. A material of the spacer layer $S_B$ needs to be a material having a small extinction coefficient with respect to the incident light, if possible. Hereinafter, it is assumed that the spacer $S_B$ is a Si layer. If the spacer layer $S_B$ is the Si layer, it is efficient because a part of the material of the block B can be commonly used to deposit the spacer layer $S_B$.

The block C is a uniform period multilayer film block obtained by laminating layer pairs which have different refractive indices and have a ratio of film thickness $\Gamma_C$ at a cycle length $d_C$ by $N_C$ times. A unit structure (that is, a layer pair) of the block C is the same (here, Mo layer or Si layer) as the layer pair of the block A.

The cycle length $d_C$ of the layer pair in the block C is represented by the sum of the film thickness of the Mo layer and the film thickness of the Si layer of the layer pair, the ratio of film thickness $\Gamma_C$ of the layer pair in the block C is a ratio of the film thickness of the Mo layer at the cycle length $d_C$, the number of laminations $N_C$ of the layer pair in the block C is the total number of layer pairs in the block C. Hereinafter, the cycle length $d_C$ of the layer pair in the block C is referred to as a "pair cycle length $d_C$", the ratio of film thickness $\Gamma_C$ of the layer pair in the block C is referred to as a "pair ratio $\Gamma_C$", and the number of laminations $N_C$ of the layer pair in the block C is referred to as a "pair number $N_C$" (the same is true of blocks of embodiments to be described below).

Hereinafter, a basic function of the multilayer film reflector 100 will be described.

Initially, the reflection characteristics of the single block C positioned on the anti-substrate side (surface side) is greatly reflected in the reflection characteristics of the multilayer film reflector 100 with respect to the incident light.

Here, in the reflection characteristics of the multilayer film reflector 100, the reflection characteristics of the single block B positioned on the substrate side of the block C is also reflected, and the reflection characteristics of the single block A positioned on the substrate side of the block B is also reflected.

The contribution of the block B to the reflection characteristics of the multilayer film reflector 100 is also changed by the spacer layer $S_B$ positioned on the anti-substrate side of the block B as well as the reflection characteristics of the single block B. The contribution of the block A to the reflection characteristics of the multilayer film reflector 100 is also changed by the spacer layer $S_A$ positioned on the anti-substrate side of the block A as well as the reflection characteristics of the single block A.

This is because the phase relationship obtained when reflection light in the block A, reflection light in the block B and reflection light in the block C overlap each other is also changed if the thicknesses of the spacer layers $S_A$ and $S_B$ are changed.

Accordingly, in the present embodiment, it is possible to give desired reflection characteristics to the multilayer film reflector 100 by merely adjusting the combination of the reflection characteristics of the single block C, the reflection characteristics of the single block A, and the reflection characteristics of the single block B, the thickness of the spacer layer $S_A$ and the thickness of the spacer layer $S_B$.

For example, the reflection characteristics, in which a reflection angle range is narrow and a peak reflectivity is high, are given to the single block C. The reflection angle range refers to an angle range indicating a reflectivity which is equal to or greater than 90% of the peak reflectivity.

In contrast, by adding the blocks A and B and the spacer layers $S_A$ and $S_B$, the peak reflectivity in the reflection characteristics of the multilayer film reflector 100 is suppressed, and the reflectivity near the peak angle thereof is adjusted to be raised, that is, a reflectivity peak shape is adjusted.

By doing this, in the multilayer film reflector 100, it is possible to obtain a substantially uniform reflectivity in a range wider than that of the single block C (that is, it is possible to allow the reflectivity peak shape to gently slope). The multilayer film reflector 100 having a wide reflection angle range is appropriate for the projection optical system of the EUV exposure apparatus.

The reflection characteristics need to be individually contributed to the multilayer film reflector applied to the projection optical system of the EUV exposure apparatus for each position on a reflection surface. This is because the angle range of the incident light to be reflected by the reflector of the projection optical system is different by the arrangement position of the reflector, and is also different by a reflection position within one reflector.

Thus, in the present embodiment, the combination of the parameters $d_A$, $\Gamma_A$, $N_A$, $d_{SA}$, $d_B$, $\Gamma_B$, $N_B$, $d_{SB}$, $d_C$, $\Gamma_C$ and $N_C$ is set for each position within the reflection surface of the multilayer film reflector 100, and the distribution within the reflection surface of this combination is set to be a smooth distribution.

The "reflection surface" of the multilayer film reflector 100 is an effective reflection surface of the multilayer film reflector 100 which contributes to the reflection of an effective pencil of light rays, and the "smooth distribution" refers to "distribution of which a gradient is continuous".

Figure 2:
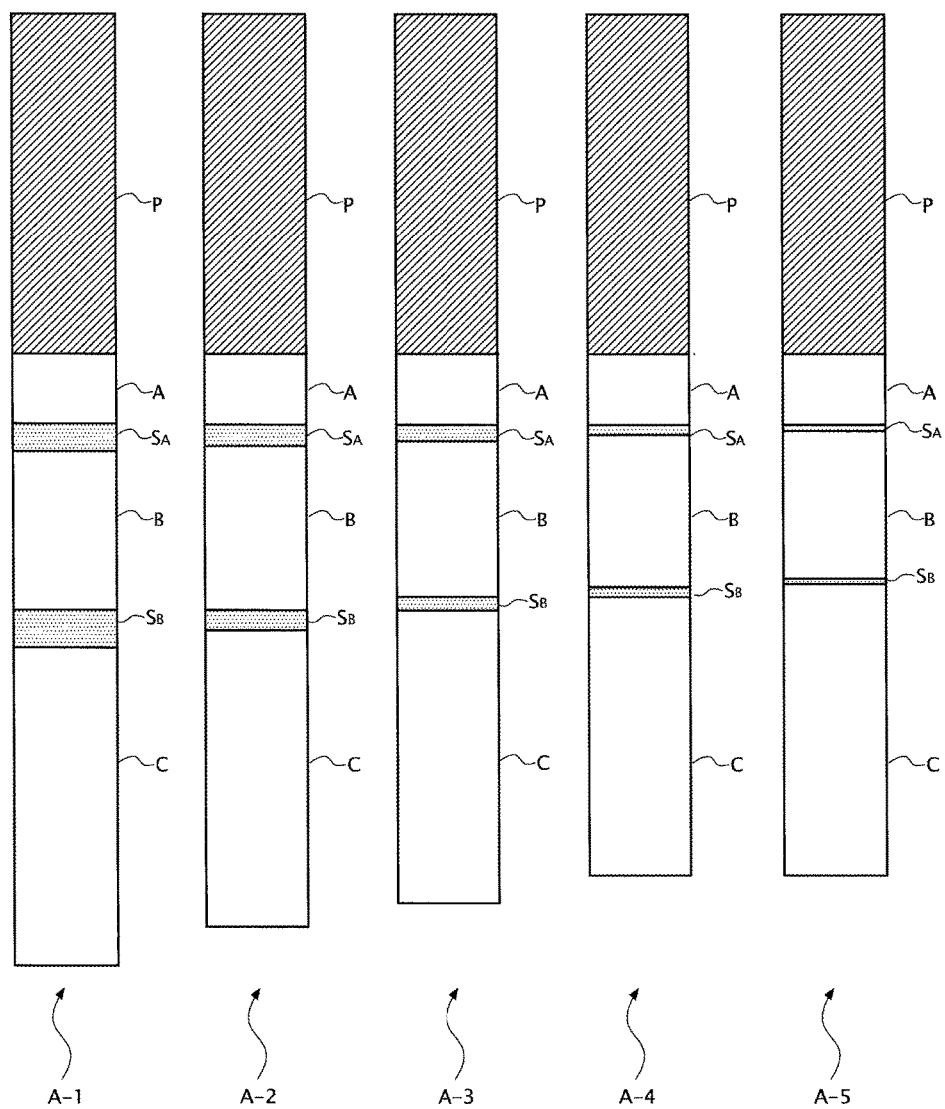
FIG. 2 is a schematic diagram for describing representative reflection points A-1 to A-5 of the multilayer film reflector according to the first embodiment.

FIG. 2 is a schematic diagram showing five representative reflection points A-1, A-2, A-3, A-4 and A-5 within the reflection surface of the multilayer film reflector 100 of the present embodiment.

The combination of the parameters $d_A$, $\Gamma_A$, $N_A$, $d_{SA}$, $d_B$, $\Gamma_B$, $N_B$, $d_{SB}$, $d_C$, $\Gamma_C$ and $N_C$ is different among these representative reflection points A-1, A-2, A-3, A-4 and A-5.

A film configuration of another reflection point within the reflection surface of the multilayer film reflector 100 is set to be an intermediate film configuration between at least two representative reflection points adjacent to the reflection point thereof. That is, the parameters $d_A$, $\Gamma_A$, $N_A$, $d_{SA}$, $d_B$, $\Gamma_B$, $N_B$, $d_{SB}$, $d_C$, $\Gamma_C$ and $N_C$ of the reflection point thereof are set to be an intermediate value of the parameters $d_A$, $\Gamma_A$, $N_A$, $d_{SA}$, $d_B$, $\Gamma_B$, $N_B$, $d_{SB}$, $d_C$, $\Gamma_C$ and $N_C$ of at least two adjacent representative reflection points.

Hereinafter, the representative reflection points A-1, A-2, A-3, A-4 and A-5 will be described in detail.

FIG. 3 is a table showing the film configurations of the representative reflection points A-1, A-2, A-3, A-4 and A-5. Numerical values in FIG. 3 are film thicknesses (nm), and the number of layer pairs of each block is a "pair number".

As shown in FIG. 3, the parameters of the representative reflection point A-1 are set as follows.
$d_A$=7.571, $\Gamma_A$=0.445, $N_A$=4,
$d_{SA}$=3.670,
$d_B$=7.571, $\Gamma_B$=0.445, $N_B$=9,
$d_{SB}$=3.670,
$d_C$=7.571, $\Gamma_C$=0.445, $N_C$=20

The parameters of the representative reflection point A-2 are set as follows.
$d_A$=7.4, $\Gamma_A$=0.2432, $N_A$=4,
$d_{SA}$=3.3,
$d_B$=7.49, $\Gamma_A$=0.332, $N_B$=9,
$d_{SB}$=3.25,
$d_C$=7.571, $\Gamma_C$=0.445, $N_C$=20

The parameters of the representative reflection point A-3 are set as follows.
$d_A$=7.4, $\Gamma_A$=0.0810, $N_A$=4,
$d_{SA}$=3,
$d_B$=7.43, $\Gamma_B$=0.219, $N_B$=9,
$d_{SB}$=2.8,
$d_C$=7.571, $\Gamma_C$=0.445, $N_C$=20

The parameters of the representative reflection point A-4 are set as follows.
$d_A$=7.4, $\Gamma_A$=0.0135, $N_A$=4,
$d_{SA}$=2.7,
$d_B$=7.39, $\Gamma_B$=0.1069, $N_B$=9,
$d_{SB}$=2.3,
$d_C$=7.571, $\Gamma_C$=0.445, $N_C$=20

The parameters of the representative reflection point A-5 are set as follows.
$d_A$=7.4, $\Gamma_A$=0.0135, $N_A$=4,
$d_{SA}$=2.4,
$d_B$=7.4, $\Gamma_B$=0.0135, $N_B$=9,
$d_{SB}$=1.8,
$d_C$=7.571, $\Gamma_C$=0.445, $N_C$=20

Accordingly, in the multilayer film reflector 100 of the present embodiment, the pair ratios $\Gamma_A$ and $\Gamma_B$ are gradually decreased over the representative reflection point A-1 to the representative reflection point A-5, and the film thicknesses $d_{SA}$ and $d_{SB}$ of the spacer layers $S_A$ and $S_B$ are gradually decreased.

Meanwhile, in the multilayer film reflector 100 of the present embodiment, other parameters are set to be a common or approximate value between the representative reflection point A-1 to the representative reflection point A-5, and at least the pair cycle length $d_C$, the pair ratio $\Gamma_C$ and the pair number $N_C$ of the block C are set to be common. Thus, within the reflection surface of the multilayer film reflector 100, parameters other than $\Gamma_A$, $\Gamma_B$, $d_{SA}$ and $d_{SB}$ are set to be uniform or to be substantially uniform.

Figure 4:
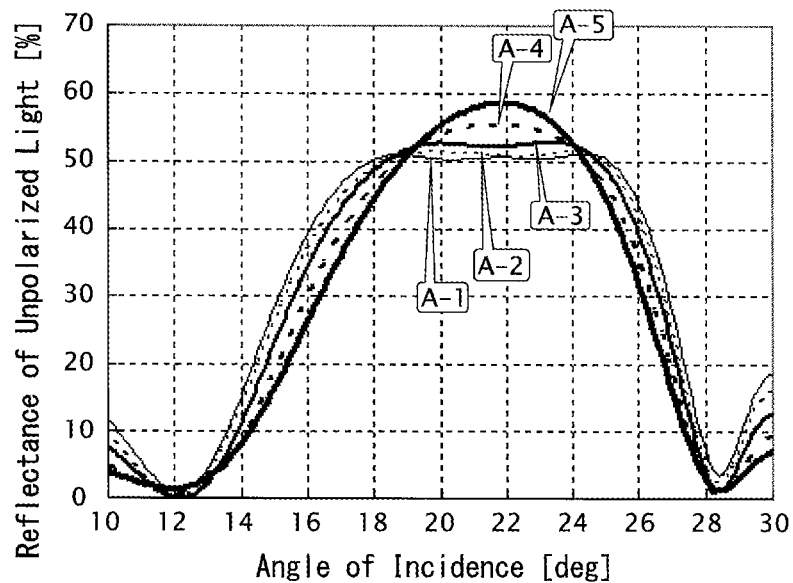
FIG. 4 is a graph showing that angle characteristics of reflectivity according to the first embodiment are represented for each representative reflection point.

FIG. 4 is a graph showing that angle characteristics of the reflectivity are represented for each representative reflection point. The angle characteristics shown in FIG. 4 are angle characteristics related to unpolarized EUV light having a wavelength of 13.5 nm.

As shown in FIG. 4, an angle characteristic curve shape is gradually changed over the representative reflection point A-1 to the representative reflection point A-5. The angle characteristic curve of the representative reflection point A-1 represents a uniform reflectivity in a relatively wide angle range, whereas the angle characteristic curve of the representative reflection point A-5 represents a relatively high reflectivity in a relatively narrow angle range. That is, the peak reflectivity is gradually increased over the representative reflection point A-1 to the representative reflection point A-5, and a width (a width in the angle range indicating a reflectivity which is equal to or greater than 90% of the peak reflectivity) of the incident light in the reflection angle range is gradually decreased. The curve shape is continuously changed over the representative reflection point A-1 to the representative reflection point A-5 without being biased or distorted.

Figure 5:
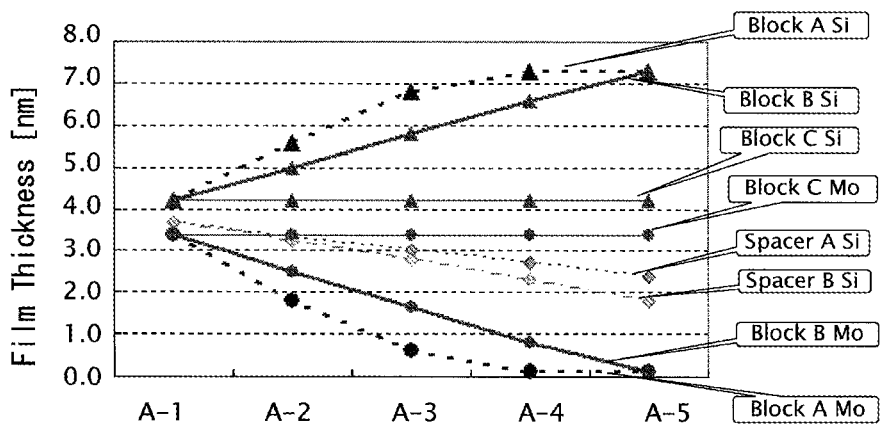
FIG. 5 is a graph showing a change in each film thickness between representative reflection points A-1 to A-5 according to the first embodiment.

FIG. 5 is a graph showing a change in each film thickness between the representative reflection points A-1 to A-5. A "spacer A" in FIG. 5 indicates a film thickness of the spacer layer SA, and a "spacer B" indicates a film thickness of the spacer layer $S_B$.

Here, in the above description, as shown in FIG. 4, a peak angle (=an angle of the incident light of which the reflectivity becomes a peak) of the EUV light having a wavelength of 13.5 nm is set to be common (near 22 degrees) between the representative reflection points A-1 to A-5, but a peak angle of at least one representative reflection point may be shifted to another value.

Here, in order to shift the peak angle of the representative reflection point, the pair cycle lengths $d_A$, $d_B$ and $d_C$ of the representative reflection may be multiplied by the common value, and the film thicknesses $d_{SA}$ and $d_{SB}$ of the representative reflection points may be multiplied by the common value.

For example, if the pair cycle lengths $d_A$, $d_B$ and $d_C$ of the representative reflection points are multiplied by 0.958 and the film thicknesses $d_{SA}$ and $d_{SB}$ of the representative reflection points are multiplied by 0.967, the peak angles of the representative reflection points can be shifted to about 15 degrees from about 22 degrees.

Figures 6, 7:
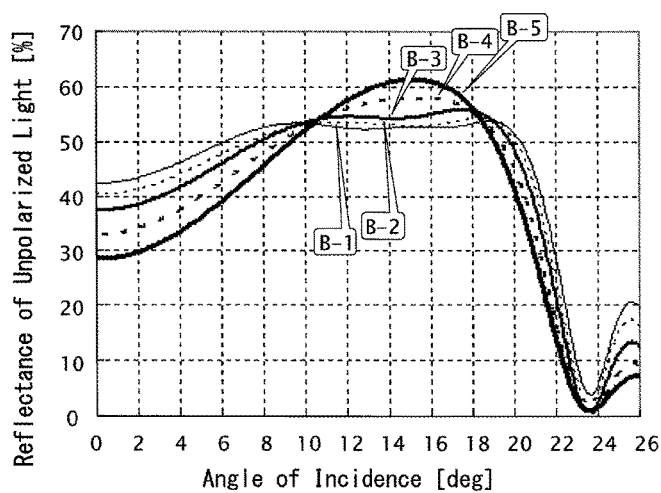
FIG. 6 is a configuration example of representative reflection points A-1 to A-5 according to a modification example of the first embodiment.
FIG. 7 is a graph showing that angle characteristics of reflectivity according to the modification example of the first embodiment are represented for each representative reflection point.

The examples shown in FIGS. 6 and 7 are obtained by setting the pair cycle lengths $d_A$, $d_B$ and $d_C$ to be 0.958 times and setting the film thicknesses $d_{SA}$ and $d_{SB}$ to be 0.967 times in the examples shown in FIGS. 3 and 4. In the examples shown in FIGS. 6 and 7, the peak angles of the representative reflection points A-1 to A-5 are set to be about 15 degrees.

As described above, in the multilayer film reflector 100 of the present embodiment, the angle characteristics (combination of the reflection angle range and the peak angle) of the reflectivity are set for each position within the reflection surface.

Accordingly, the multilayer film reflector 100 of the present embodiment is appropriate for an optical system of which a target value of the angle characteristics (combination of the reflection angle range and the peak angle) of the reflectivity is different by the position of the reflection surface, for example, the projection optical system of the EUV exposure apparatus.

In the multilayer film reflector 100 of the present embodiment, parameters other than the "pair ratio of the substrate-side block and the film thickness of the spacer layer" are set to be common or to be substantially common between the positions within the reflection surface. The "substrate-side block" is one of the second and subsequent blocks from the anti-substrate side, and an "anti-substrate-side block" is the first block from the anti-substrate side.

Therefore, according to the multilayer film reflector 100 of the present embodiment, the number of design parameters at the time of designing the film and the number of adjustment parameters at the time of film deposition can be suppressed.

Since the materials of all the layers are common between the positions within the reflection surface, a process of depositing all the layers can be common (see a fourth embodiment to a ninth embodiment to be described below).

Since the film configuration and the reflection characteristics are continuously changed between the positions within the reflection surface, appropriate reflection characteristics of the positions within the reflection surface can be obtained only by continuously changing some of the film deposition parameters in the film deposition process (see the fourth embodiment to the ninth embodiment to be described below).

In the present embodiment, it has been described that the main parameters set to each position within the reflection surface of the multilayer film reflector 100 are the "pair ratios $\Gamma_A$ and $\Gamma_B$ of the substrate-side blocks and the film thicknesses $d_{SA}$ and $d_{SB}$ of the spacer layers". However, it is needless to say that other parameters may be added.

For example, in the present embodiment, the parameters (pair cycle length $d_C$, pair ratio $\Gamma_C$, and the pair number $N_C$) of the anti-substrate-side block (block C) are common between the positions within the reflection surface, but the parameters may not be common between the positions within the reflection surface.

It has been described in the present embodiment that the pair ratio $\Gamma$ is adjusted between the positions within the reflection surface in order to adjust the contribution of the block to the reflection characteristics of the multilayer film reflector 100 between the positions within the reflection surface, but the method of adjusting the contribution of the block is not limited to the method of adjusting the pair ratio $\Gamma$. For example, in addition to the method of adjusting the pair ratio $\Gamma$, at least one of the following methods (a) to (d) may be adopted.

(a) A method of forming a thermal diffusion layer on the surface of the block and adjusting the contribution of the block by the thermal diffusion layer by heating the substrate P and causing interfacial diffusion to proceed after the block is deposited.

(b) A method of adjusting the contribution of the block by surface roughness of the substrate P which is a deposited position of the block.

(c) A method of adjusting the surface roughness of the block and adjusting the contribution of the block by performing planarization on the surface through ion beam irradiation after the block is deposited. Here, when the surface roughness is decreased by a planarization effect at the time of film deposition, for example, when the film deposition of the block is performed through ion beam sputtering, since it is not necessary to perform the planarization again, another method is adopted in order to adjust the contribution of the block.

(d) A method of depositing a layer which is made of a material having high absorption properties and Si on the surface of the block and adjusting the contribution of the block by the deposited layer. Here, the total optical thickness of the absorption material and the Si layer is set to be about ¼ of the wavelength of the incident light.

It has been described in the multilayer film reflector 100 of the present embodiment that the total number of uniform period multilayer film blocks is 3, but the total number of uniform period multilayer film blocks is not limited thereto. The total number of uniform period multilayer film blocks may be two or four or more. For example, even though the block A (and the spacer layer SA) in the multilayer film reflector 100 of the present embodiment is omitted, a certain effect can be obtained.

It has been described in the present embodiment that the combination of the parameters is set to each position within the reflection surface. However, it is needless to say that regions whose parameter combination are the same to one another may be partially present within the reflection surface. Even in this case, the combination distribution of the parameters is set to be a smooth distribution within the reflection surface of the multilayer film reflector 100.

It has been described in the present embodiment that the combination of the parameters is set to each position within the reflection surface. However, it is needless to say that the combination of the parameters may be set to each region. Even in this case, the combination distribution of the parameters is set to be a smooth distribution within the reflection surface of the multilayer film reflector 100.

In any case, the external appearance of the multilayer film reflector 100, the shape of the reflection surface and the combination distribution of the parameters in the reflection surface are appropriately set depending on the arrangement position of the multilayer film reflector 100 in the projection optical system (for example, see the third embodiment to be described below).

Second Embodiment

Hereinafter, an embodiment of the multilayer film reflector will be described as a second embodiment of the present invention. Here, a difference from the first embodiment will be primarily described.

It has been described in the first embodiment that the "combination of the pair ratio of the substrate-side block and the film thickness of the spacer layer" is used as the main parameters set to each position within the reflection surface. However, in the present embodiment, "combination of the pair number of the substrate-side block and the pair number of the anti-substrate-side bock" is used as the main parameters set to each position within the reflection surface.

Figure 8:
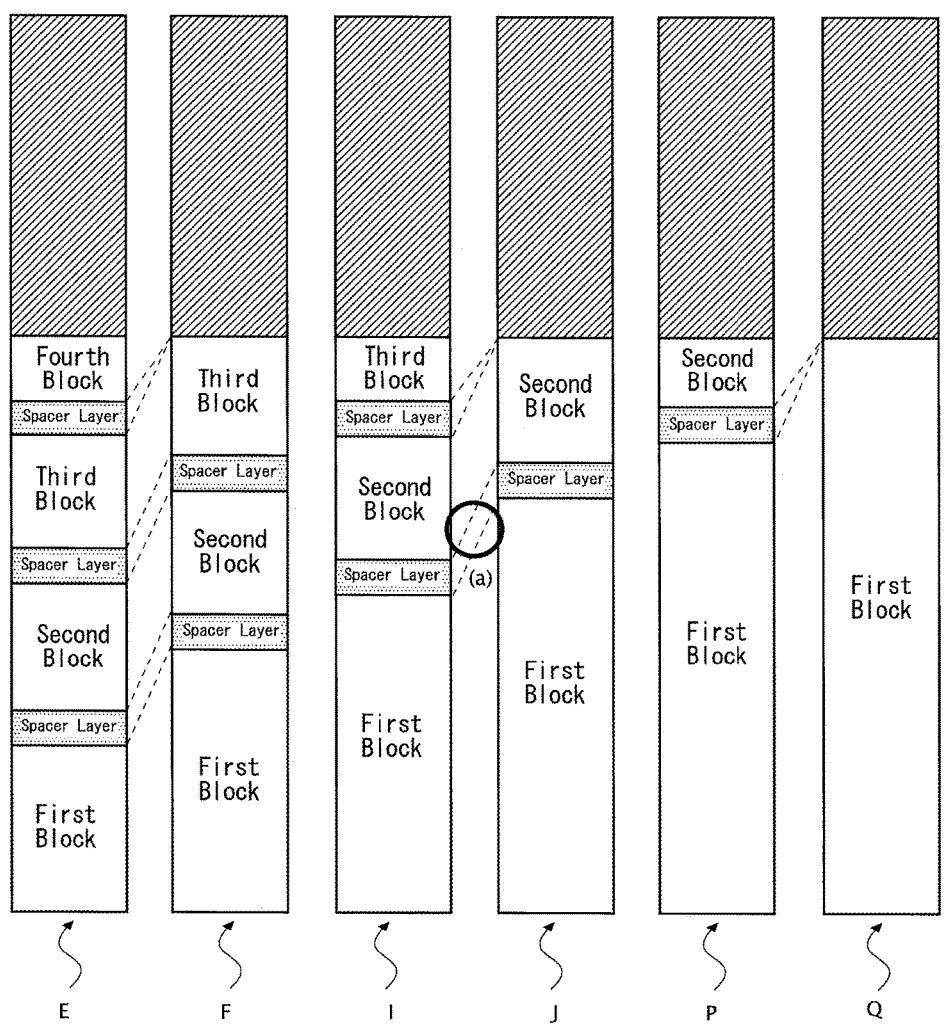
FIG. 8 is a schematic diagram for describing representative reflection points E, F, I, J, P and Q of a multilayer film reflector according a second embodiment.

FIG. 8 is a schematic diagram showing six representative reflection points E, F, I, J, P and Q within the reflection surface of the multilayer film reflector of the present embodiment, and FIG. 9 is a table showing film configurations of 17 representative reflection points A to Q including these six representative reflection points E, F, I, J, P and Q. Numerical values in FIG. 9 are pair numbers N of the blocks, and in FIG. 9, the plurality of blocks are sequentially referred to as a "first block", a "second block", a "third block", and a "fourth block" from the anti-substrate-side (surface side).

A film configuration of another reflection points within the reflection surface of the multilayer film reflector of the present embodiment are set to be an intermediate film configuration between the film configurations of at least two representative reflection points adjacent to the reflection point. That is, the parameter of the reflection point is set to an intermediate value of the parameters of at least two adjacent representative reflection points.

Hereinafter, the representative reflection points A to Q will be described in detail.

As shown in FIGS. 8 and 9, in the present embodiment, the pair number N of the substrate-side block is gradually decreased over the representative reflection point A to the representative reflection point Q, whereas the pair number N of the anti-substrate-side block is gradually increased.

The pair number N of the substrate-side block is decreased, and if the pair number becomes zero, the block disappears. Thus, as shown in FIG. 8, the number of blocks is decreased from the representative reflection point E to the representative reflection point F by one, the number of blocks is decreased from the representative reflection point I to the representative reflection point J by one, and the number of blocks is decreased from the representative reflection point P to the representative reflection point Q by one.

Although not shown in FIG. 9, each of the first block to the fourth block is the uniform period multilayer film block including the Mo layer and the Si layer. The thickness of the Mo layer in each of these blocks is 3.1 nm, and the thickness of the Si layer in each of these blocks is 4.2 nm. Although not shown in FIG. 9, the spacer layer including the Si layer having a film thickness of 3.6 nm is formed on the anti-substrate side of each of the second block to the fourth block.

As shown in FIG. 9, the total pair number from the substrate side to the anti-substrate side is common between the plurality of representative reflection points A to Q. Thus, in the present embodiment, the total film thickness from the substrate side to the anti-substrate side is common between the plurality of representative reflection points A to Q. Accordingly, the total film thickness from the substrate side to the anti-substrate side is uniformly set within the reflection surface of the multilayer film reflector.

Here, a film configuration of a gap represented by reference numeral (a) in FIG. 8 will be described in detail.

Figure 10:
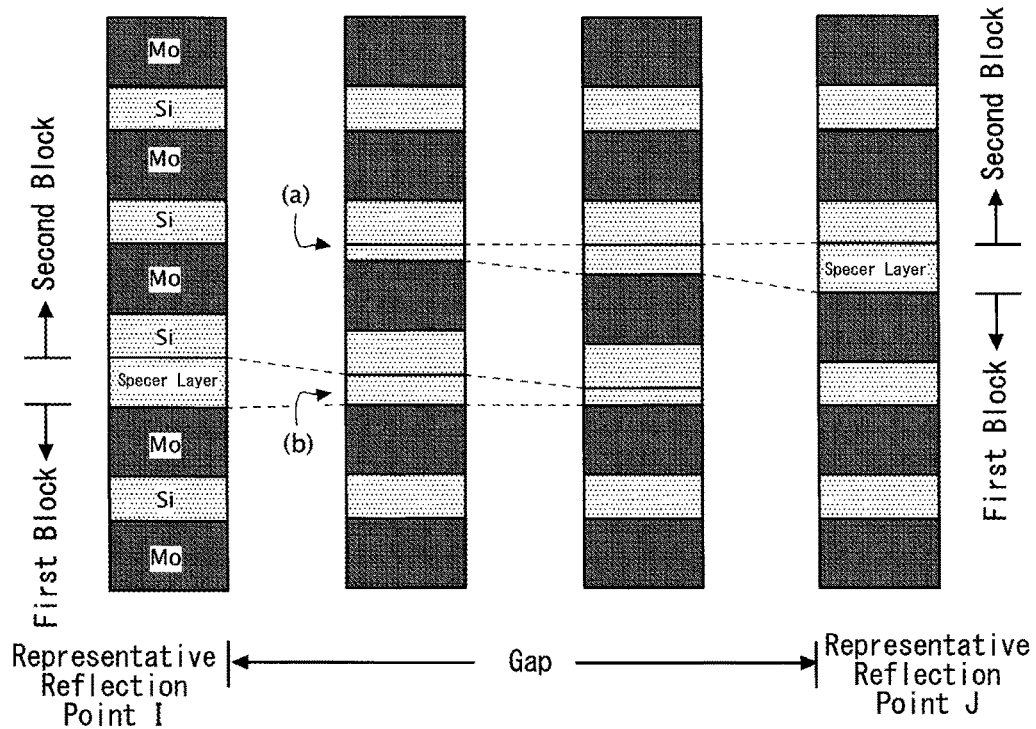
FIG. 10 is a diagram for describing a change of a spacer layer in a gap between the representative reflection points I and J.

This gap is a gap between the representative reflection point I and the representative reflection point J, and is a gap between the anti-substrate-side block (first block) and the substrate-side blocks (second or third block). In this gap, the spacer layer positioned between the substrate-side block and the anti-substrate-side block is gradually displaced as the spacer layer becomes closer to the representative reflection point J from the representative reflection point I. FIG. 10 is a diagram that specifically describes this gap.

As shown in FIG. 10, in this gap, the arrangement position of the spacer layer is gradually displaced toward the substrate side from the anti-substrate side as it proceeds to the representative reflection point J from the representative reflection point I.

In this gap, the arrangement position of the spacer layer is not set between the layer pair (Mo/Si), and instead, the spacer layer is divided into a spacer layer (a) positioned on the substrate side of a certain layer pair (Mo/Si) and a spacer layer (b) positioned on the anti-substrate side.

In this gap, a ratio of the film thickness of the spacer layer (a) on the substrate side to the film thickness of the spacer layer (b) on the anti-substrate side is continuously increased toward the representative reflection point J from the representative reflection point I.

In this gap, the sum of the film thickness of the spacer layer (a) on the substrate side and the film thickness of the spacer layer (b) on the anti-substrate side is set to be equal to the film thickness (=3.6 nm) of the spacer layer in the representative reflection point I or the representative reflection point J.

Accordingly, in this gap, the visually observed film thickness of the spacer layer is maintained, and only the visually observed arrangement position of the spacer layer is continuously displaced.

Although the spacer layer in the gap shown as (a) in FIG. 8 has been described, it is assumed that a spacer layer in another gap is similarly adjusted (the visually observed arrangement position is continuously changed).

Figure 11:
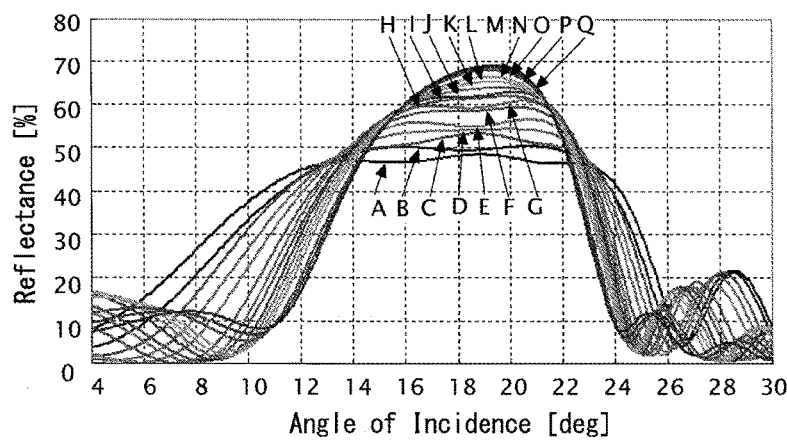
FIG. 11 is a graph showing that angle characteristics of reflectivity according to the second embodiment are represented for each representative reflection point.

FIG. 11 is a graph showing that the angle characteristics of the reflectivity are represented for each representative reflection point. The angle characteristics shown in FIG. 11 are angle characteristics with respect to the unpolarized EUV light having a wavelength of 13.5 nm.

As shown in FIG. 11, the angle characteristic curve shape is gradually changed over the representative reflection point A to the representative reflection point Q. The angle characteristic curve of the representative reflection point A represents a uniform reflectivity in a relatively wide angle range, whereas the angle characteristic curve of the representative reflection point Q represents a relatively high reflectivity in a relatively narrow angle range. That is, the peak reflectivity is gradually increased over the representative reflection point A to the representative reflection point Q, and the reflection angle range (angle range indicating a reflectivity which is equal to or greater than 90% of the peak reflectivity) of the incident light is gradually decreased. The curve shape is continuously changed over the representative reflection point A to the representative reflection point Q without being biased or distorted.

As mentioned above, in the multilayer film reflector of the present embodiment, the angle characteristics (combination of the reflection angle range, the peak reflectivity and the peak angle) of the reflectivity are set for each position within the reflection surface.

Accordingly, the multilayer film reflector of the present embodiment is appropriate for an optical system of which a target value of the angle characteristics (combination of the reflection angle range and the peak angle) of the reflectivity is different by the position of the reflection surface, for example, the projection optical system of the EUV exposure apparatus.

In the multilayer film reflector of the present embodiment, parameters other than the "pair number of the substrate-side block and the pair number of the anti-substrate-side block" are set to be common between the positions within the reflection surface.

Therefore, according to the multilayer film reflector, the number of design parameters at the time of designing the film and the number of adjustment parameters at the time of film deposition can be suppressed.

Since the materials of all the layers are common between the positions within the reflection surface, many film deposition processes can be common (see the fourth embodiment to the ninth embodiment to be described below).

Since the film configuration and the reflection characteristics are continuously changed between the positions within the reflection surface, appropriate reflection characteristics of the positions within the reflection surface can be obtained only by continuously changing some of the film deposition parameters in the film deposition process (see the fourth embodiment to the ninth embodiment to be described below).

Similarly to the multilayer film reflector of the first embodiment, the multilayer film reflector of the present embodiment can be variously modified.

For example, it has been described in the present embodiment that the "pair number of the substrate-side block and the pair number of the anti-substrate-side block" is used as the main parameters set to each position within the reflection surface of the multilayer film reflector, but other parameters may be added.

For example, it has been described in the multilayer film reflector of the present embodiment that the maximum total number of uniform period multilayer film blocks is 4 (the number of blocks of the representative reflection points A and B of which the number of blocks is maximum is 4), but the number of blocks is not limited thereto. The number of blocks may be two or four or more.

Although it has been described in the multilayer film reflector of the present embodiment that the minimum total number of uniform period multilayer film blocks is 1 (the number of blocks of the representative reflection point Q of which the number of blocks is minimum is 1), the number of blocks is not limited thereto. The number of blocks may be two or more.

Supplementation of First Embodiment or Second Embodiment

Figure 12:
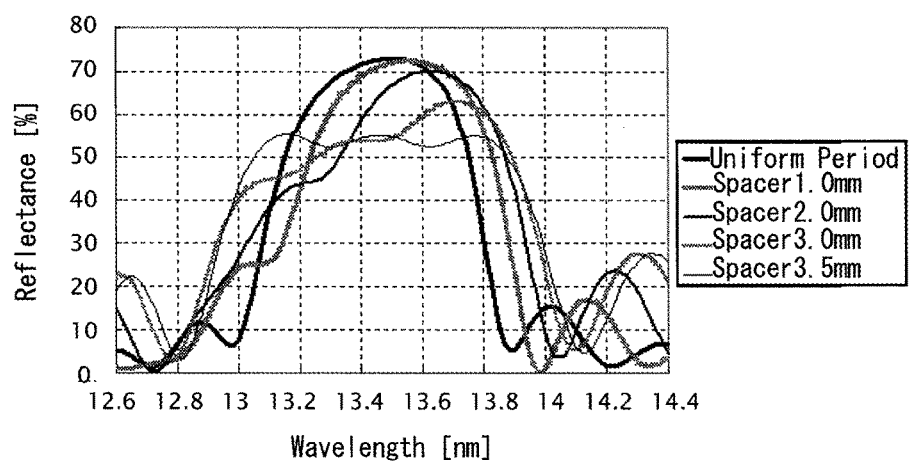
FIG. 12 shows a comparative example for describing the first embodiment or the second embodiment.

FIG. 12 is a graph showing wavelength characteristics of the reflectivity for some multilayer films. The wavelength characteristics shown in FIG. 12 are wavelength characteristics related to direct incident EUV light having a wavelength of 13.5 nm.

A "uniform period" in FIG. 12 is a multilayer film having a uniform period structure obtained by laminating a layer pair including a Mo layer of 3 nm and a Si layer of 3.935 nm by 34 times.

"Spacer 1.0 nm" in FIG. 12 is obtained by inserting a spacer layer which is made of Si and has a film thickness of 1.0 nm between a ninth layer pair and a tenth layer pair from the substrate side and inserting a spacer layer which is made of Si and has a film thickness of 1.0 nm between a fourteenth layer pair and a fifteenth layer pair from the substrate side in the uniform period multilayer film.

"Spacer 2.0 nm" in FIG. 12 is obtained by inserting a spacer layer which is made of Si and has a film thickness of 2.0 nm between the ninth layer pair and the tenth layer pair from the substrate side and inserting a spacer layer which is made of Si and has a film thickness of 2.0 nm between the fourteenth layer pair and the fifteenth layer pair from the substrate side in the uniform period multilayer film.

"Spacer 3.0 nm" in FIG. 12 is obtained by inserting a spacer layer which is made of Si and has a film thickness of 3.0 nm between the ninth layer pair and the tenth layer pair from the substrate side and inserting a spacer layer which is made of Si and has a film thickness of 3.0 nm between the fourteenth layer pair and the fifteenth layer pair from the substrate side in the uniform period multilayer film.

"Spacer 3.5 nm" in FIG. 12 is obtained by inserting a spacer layer which is made of Si and has a film thickness of 3.5 nm between the ninth layer pair and the tenth layer pair from the substrate side and inserting a spacer layer which is made of Si and has a film thickness of 3.5 nm between the fourteenth layer pair and the fifteenth layer pair from the substrate side in the uniform period multilayer film.

It can be seen that a width of a reflection wavelength band is widened by inserting the spacer layer having the thickness of 3.5 nm, and a uniform reflectivity is obtained in a wide wavelength band.

Here, in the course of change in the film thickness of the spacer layer from 0 nm to 3.5 nm, a wavelength (peak wavelength) in which the reflectivity becomes a peak is biased to a long wavelength and a non-preferred wavelength characteristics in which the reflectivity is increased after the reflectivity is greatly decreased in, for example, a wavelength of 13.2 nm is exhibited.

Accordingly, if the parameter set to each position within the reflection surface is "only the film thickness of the spacer layer", there is a concern that the peak wavelength is deviated between the positions within the reflection surface.

In this respect, in the above-described first embodiment, since "the combination of the pair ratio of the substrate-side block and the film thickness of the spacer layer" is used as the parameter set to each position within the reflection surface, central angles in the angle range in which a high reflectivity is obtained can be matched between the positions within the reflection surface. In the above-described second embodiment, since "the combination of the pair number of the substrate-side block and the pair number of the anti-substrate-side block" is used as the parameter set to each position within the reflection surface, the peak wavelengths can be matched between the positions within the reflection surface.

Although it has been described in the above-described first embodiment or second embodiment that the Mo layer and the Si layer are used as the layer pair of the uniform period multilayer film, the material of the layer pair of the uniform period multilayer film may be appropriately changed depending on the wavelength band of the EUV light. For example, when a EUV wavelength band near 11.3 nm is used as the use wavelength, it is possible to obtain a high reflectivity by using a molybdenum layer (Mo layer) and a beryllium layer (Be layer) as the layer pair of the uniform period multilayer film.

In the above-described first embodiment or second embodiment, as the material of one layer of the layer pair of the uniform period multilayer film, ruthenium (Ru), molybdenum carbide ($Mo_2C$), molybdenum oxides ($MoO_2$), or molybdenum disilicide ($MoSi_2$) may be used. As the material of the other layer of the layer pair of the uniform period multilayer film, silicon carbide (SiC) may be used.

In the above-described first embodiment or second embodiment, a diffusion suppression layer that suppresses the diffusion of the material for forming these multilayer films may be formed between the one layer and the other layer of the layer pair of the uniform period multilayer film. An oxidation inhibition layer may be formed on a surface layer of the multilayer film.

Third Embodiment

Hereinafter, a further specific embodiment of the multiplayer film reflector will be described as a third embodiment of the present invention. Here, the portions described in the first embodiment or second embodiment will be omitted.

Figure 13:
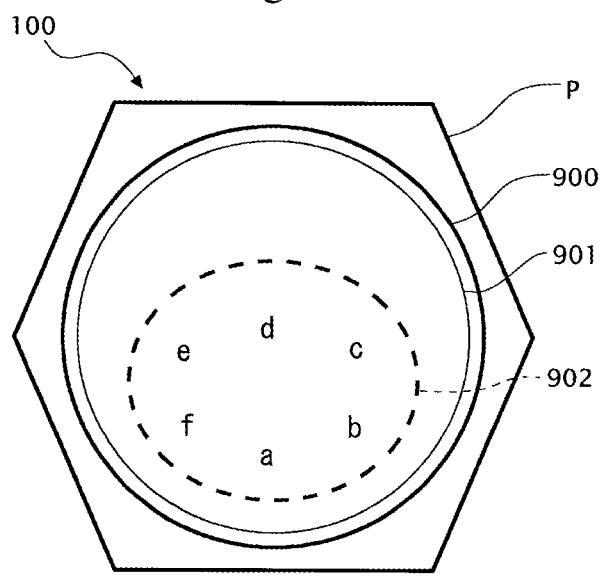
FIG. 13 is a diagram when a substrate of a third embodiment is viewed from an incident side of light.

FIG. 13 is a diagram when the substrate P of the multilayer film reflector of the present embodiment is viewed from the incident side of light.

As shown in FIG. 13, the external appearance of the substrate P is, for example, hexagonal shape, and a structure (not shown) for holding the substrate P is formed at an outer periphery of the substrate P. The surface of the substrate P has, for example, an aspherical shape in which a recess surface is rotationally symmetric, and is polished so as to have a roughness less than 0.1 nmrms. An area represented by reference numeral 900 in FIG. 13 is a polishing area. A region inside a circular frame slightly smaller than the polishing area 900 is a film deposition region 901 of the multilayer film, and a region inside an elliptical frame within the film deposition region 901 is an effective region 902.

In the present embodiment, the incident angle range of the EUV light ($\lambda=13.5$ nm) onto the effective region 902 is 21 degrees to 23 degrees in a point a of this drawing, is 18 degrees to 25 degrees in points b and c, 14 degrees to 16 degrees in a point d, and is 10 degrees to 19 degrees in points e and f.

Thus, in the present embodiment, the combination of parameters in the representative reflection point a in the effective region 902 is set to be the same combination as that of the representative reflection point A-5 (see FIG. 3) described above. The combinations of parameters in the representative reflection points b and c are set to be the same combination as that of the representative reflection point A-1 (see FIG. 3) described above. The combinations of parameters in the representative reflection points d, e and f are set to be the same combination as that of the representative reflection point B-5 (see FIG. 6) described above.

In the present embodiment, parameters of a reflection point other than the representative reflection points a, b, c, d and f in the effective region 902 are set to be an intermediate value between the parameters of at least two representative reflection points adjacent to the reflection point.

In the present embodiment, the combination distribution of the parameters in the effective region 902 is set to be a smooth distribution.

As a result, the reflectivity of the effective region 902 with respect to the EUV light (wavelength of 13.5 nm) is 50% to 61%. Thus, according to the multilayer film reflector 100 of the present embodiment, it is possible to improve the performance of the projection optical system by suppressing the unevenness of the transmissivity within the pupil of the projection optical system.

The uniform period multilayer film of which the pair number is 50 is formed in the same effective region 902, and if only the distribution is given to the pair cycle length, the reflectivity of the effective region 902 is 40% to 70%. Therefore, according to the multilayer film reflector in this case, the evenness of the transmissivity within the pupil of the projection optical system is degraded, and the optical performance of the projection optical system is degraded.

If the parameters of the entire effective region 902 are set to be the same as the parameters of the representative reflection point A-1, the reflectivity of the effective region 902 is 50% to 54%. Therefore, according to the multilayer film reflector in this case, an average transmissivity within the pupil is decreased without degrading the evenness of the transmissivity within the pupil of the projection optical system.

Accordingly, it is apparent that the multilayer film reflector 100 of the present embodiment is appropriate for the projection optical system.

In the multilayer film reflector 100 of the present embodiment, since the distribution is given to the film thickness of each layer, there is a concern that a wavefront shape of the EUV light is deformed due to the distribution influence. In this case, a layer of the film thickness distribution may be added as a base on the substrate side such that such deformation is minimized. The "deformation" mentioned herein indicates deformation other than appropriate deformation caused by the surface shape (here, the aspherical shape of the recess surface).

Fourth Embodiment

Hereinafter, an embodiment of a film deposition apparatus will be described as a fourth embodiment of the present invention. The film deposition apparatus of the present embodiment can be applied to the manufacturing of the multilayer film reflector described in any of the first embodiment to the third embodiment.

Figure 14A:
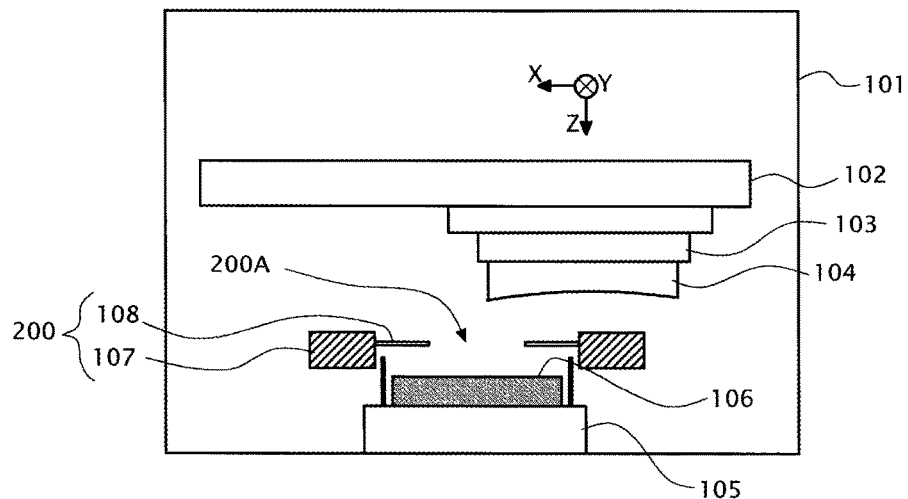
FIGS. 14A and 14B are configuration diagrams of a film deposition apparatus of a fourth embodiment.

FIG. 14A is a configuration diagram of the film deposition apparatus of the present embodiment. As shown in FIG. 14A, the deposition apparatus is a magnetron sputtering film deposition apparatus in which a substrate stage 102, a magnetron cathode 105, and a variable throttle mechanism 200 are accommodated in a vacuum vessel 101.

A target 106 such as a Mo target is attached to the cathode 105. Although only one cathode 105 is illustrated in FIG. 14, as many cathodes (for example, four cathodes) as the number of types of layers to be formed on the substrate 104 are accommodated in the actual vacuum vessel 101, and different types of targets are attached to these cathodes.

The substrate 104 as a film deposition target is attached onto the substrate stage 102 with a holder 103 interposed therebetween, and the surface of the substrate 104 faces the cathode 105. The substrate stage 102 can rotate the substrate 104 around a predetermined rotational axis, and can straightly move the substrate 104 in an X-axis direction, a Y-axis direction and a Z-axis direction, respectively.

The variable throttle mechanism 200 is provided on the substrate side of the target 106, and includes an aperture 200A having an almost rectangular shape. A transverse direction of the aperture 200A coincides with the X-axis direction of the substrate stage 102, and a longitudinal direction of the aperture 200A coincides with the Y-axis direction of the substrate stage 102. It is assumed that a width of the aperture 200A in a Y direction is sufficiently greater than a width of the substrate 104 in a Y direction.

A shape of the film deposition region on the surface of the substrate 104 is defined by the shape of the aperture 200A. Here, the film deposition region refers to a region at which sputter particles released from the target 106 arrive, and is the substantially same as a region of the surface of the substrate 104 which directly faces the aperture 200A. If the substrate 104 passes (scans) through the film deposition region, a film is formed in a portion scanned in the film deposition region of the surface of the substrate 104.

Figure 14B:
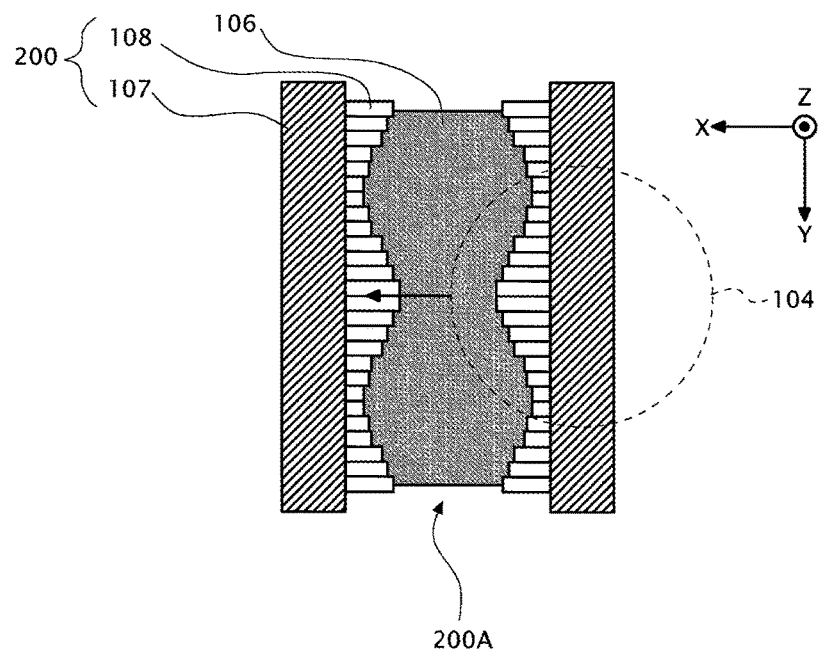

FIG. 14B is a diagram for describing the variable throttle mechanism 200. As shown in FIG. 14B, the variable throttle mechanism 200 includes a plurality of shielding plates 108 having a strip shape sufficiently smaller than a size of the aperture 200A, a plurality of shielding plate stages (not shown) which individually holds these shielding plates 108 and is capable of being moved in the X-axis direction, and an aperture width varying mechanism 107 which individually drives these shielding plate stages.

The aperture width varying mechanism 107 can freely set the shape (that is, a Y-direction distribution of the width of the aperture 200A in the X direction) of the aperture 200A by independently setting the positions of the plurality of shielding plates 108 in the X direction. The aperture width varying mechanism 107 can freely change the shape (that is, the Y-direction distribution of the width of the aperture 200A in the X direction) of the aperture 200A with time by independently changing the positions of the plurality of shielding plates 108 in the X direction with time.

In the film deposition apparatus having the above-described configuration, during the film deposition, the substrate stage 102 moves the substrate 104 in parallel in the X direction without rotating the substrate 104, and the aperture width varying mechanism 107 changes the shape (the Y-direction distribution of the width of the aperture 200A in the X direction) of the aperture 200 with time.

Here, a film deposition time at a certain point on the substrate 104 depends on a time required for this point to pass through the film deposition region.

Thus, the width varying mechanism 107 controls the film thickness distribution in the Y-axis direction by changing the width of the aperture 200A in the X direction in the Y-axis direction, and controls the film thickness distribution in the X-axis direction by changing the width of the aperture 200a in the X direction with time.

Thus, according to the film deposition apparatus of the present embodiment, it is possible to form a layer of a free film thickness distribution on the surface of the substrate 104 in both the X direction and the Y direction. According to the film deposition apparatus of the present embodiment, the target which directly faces the substrate 104 is switched, and if the aforementioned control is performed before and after the target is switched, different film thickness distributions can be obtained between a plurality of layers laminated on the substrate 104.

Therefore, according to the film deposition apparatus of the present embodiment, it is possible to deposit the multilayer film described in any of the first embodiment to the third embodiment on the substrate 104.

It has been described in the present embodiment that the substrate stage 102 does not rotate the substrate 104 on the assumption that the layer of the rotationally unsymmetrical distribution is formed on the substrate 104. It is needless to say that when the layer of the rotationally symmetrical distribution is formed on the substrate 104, the substrate stage 102 may rotate the substrate 104 at a sufficient velocity.

In the film deposition apparatus of the present embodiment, a plurality of cathodes 105 which holds different types of targets is prepared, and if the plurality of cathodes 105 is arranged in the X direction, a plurality of layers made of different materials can be sequentially laminated on the substrate 104 (in this case, the variable throttle mechanism 200 is preferably provided at each of the plurality of cathodes 105).

In the film deposition apparatus of the present embodiment, a distance between the target 106 and the substrate 104 may be varied, or a posture of the target 106 or the substrate 104 may be varied.

In the film deposition apparatus of the present embodiment, the movement velocity of the substrate stage 102 may be a uniform velocity or a non-uniform velocity.

It has been described in the film deposition apparatus of the present embodiment that in order to vary an aperture width of the cathode 105, the position of the shielding plate 108 is varied. However, instead of varying the position of the shielding plate 108, or in addition to varying the position of the shielding plate 108, the posture of the shielding plate 108 may be varied (in this case, for example, the shielding plate 108 may be rotated around a predetermined axis).

Although the magnetron sputtering film deposition apparatus has been described in the present embodiment, the present invention is applicable to an ion-beam film deposition apparatus or an evaporation film deposition apparatus.

Fifth Embodiment

Hereinafter, an embodiment of a film deposition method will be described as a fifth embodiment of the present invention. The film deposition method of the present embodiment is applicable to the manufacturing of the multilayer film reflector described in any of the first embodiment to the third embodiment. In the present embodiment, it is assumed that the sputtering method is used as in the fourth embodiment. However, in the present embodiment, a shielding mask in which an aperture shape is fixed is used in place of the throttle (variable throttle) in which the aperture shape is varied.

(Basic Film Deposition Method of Fifth Embodiment)

FIG. 15 is a diagram for describing a basic film deposition method of the present embodiment. Here, it is assumed that the surface shape of the substrate 104 as the film formation target is a rotationally symmetric aspherical surface.

Figure 15A:
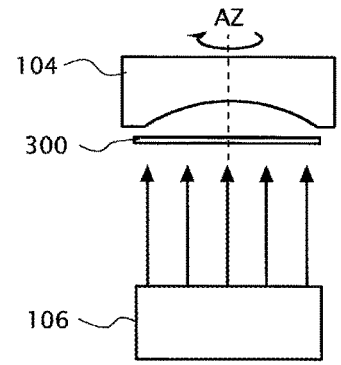
FIGS. 15A and 15B are diagrams for describing a basic film deposition method according to a fifth embodiment.
Figure 15B:
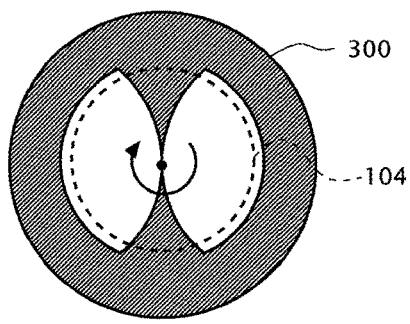

As shown in FIG. 15A, in the basic film deposition method, the film deposition is performed on the surface of the substrate 104 by causing the sputtering particles output from the target 106 to arrive at the surface thereof. During the film deposition, for example, a shielding mask 300 as shown in FIG. 15B is disposed between the substrate 104 and the target 106, and for example, the substrate 104 is rotated with an aspheric axis of the substrate 104 as a rotation axis as shown in FIG. 15A. In the basic film deposition method, the center of an aperture of the shielding mask 300 is matched to the rotation axis of the substrate 104. For example, as the shielding mask 300, a mask in which an aperture is partially formed in a mask substrate made of metal is used.

First Example of Fifth Embodiment

FIG. 16 is a diagram for describing a first example of the fifth embodiment. In the first example, it is assumed that a film thickness distribution of a layer formed on the substrate 104 is an off-axis rotational symmetry distribution. The "off-axis rotational symmetry distribution" refers to a rotationally symmetric distribution around an axis deviated from the aspheric axis of the substrate 104.

Figure 16A:
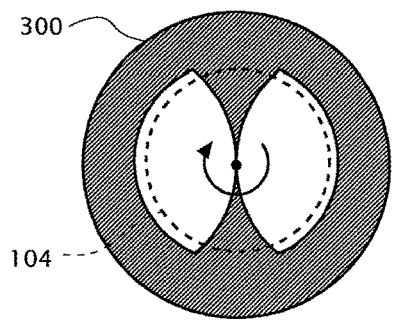
FIGS. 16A, 16B, 16C, 16D and 16E are diagrams for describing a first example of the fifth embodiment.
Figure 16B:
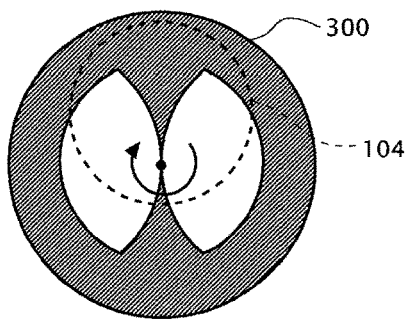

In the present example, for example, the aperture center of the shielding mask 300 is offset against the rotation axis of the substrate 104 as shown in FIG. 16B. As stated above, if the shielding mask 300 is offset, the symmetric axis of the film thickness distribution of the layer formed on the substrate 104 can be deviated from the aspheric axis of the substrate 104.

Figure 16C:
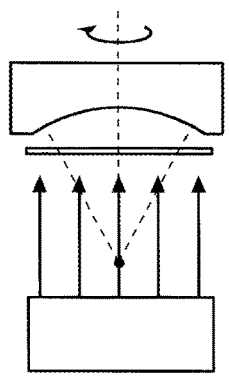
Figure 16D:
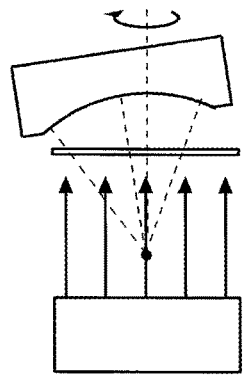

Although it has been described in this example that the shielding mask 300 is offset, the film deposition may be performed in a state in which the substrate 104 is tilted instead of offsetting the shielding mask 300, as shown in FIG. 16D.

It is assumed that even in the state in which the substrate 104 is tilted, a curvature center of an approximate spherical surface of the surface of the substrate 104 is not deviated from the rotation axis of the substrate 104. To achieve this, the substrate 104 may be tilted such that the surface of the substrate 104 is parallel to the approximate spherical surface.

Figure 16E:
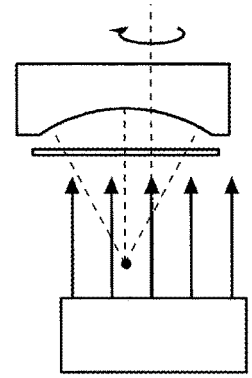

Here, the film thickness distribution of the layer formed on the substrate 104 is determined by a distance between the substrate 104 and the target 106. Thus, if the substrate 104 is shifted while the aspheric axis of the substrate 104 is maintained in parallel with the rotation axis of the substrate 104 as shown in FIG. 16E, a distance distribution between the substrate 104 and the target 106 and the film thickness distribution are rotationally unsymmetrical with respect to the aspheric axis of the substrate 104.

However, if the substrate 104 is tilted as shown in FIG. 16D, the distance distribution between the surface of the substrate 104 and the target 106 and the film thickness distribution are rotationally symmetrical with respect to the rotation axis of the substrate 104 (the same is true of the basic arrangement shown in FIG. 16C).

Therefore, in the present example in which the substrate 104 is appropriately tilted, a film thickness distribution error of the layer formed on the surface of the substrate 104 is suppressed so as to be small.

Second Example of Fifth Embodiment

FIGS. 17, 18 and 19 are diagrams for describing a second example of the fifth embodiment. Here, a difference from the first example will be described.

In the present example, it is assumed that the film thickness distribution formed on the substrate 104 has a tilt distribution. The "tilt distribution" refers to a distribution obtained by expressing a film thickness distribution in a specific direction by a linear function of a position in this direction. If the film thickness distribution has, for example, a surface shape, the "tilt distribution" corresponds to a tilt component.

Figure 17A:
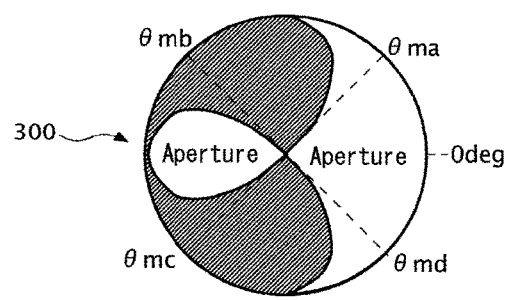
FIGS. 17A, 17B, 17C and 17D represent a first diagram for describing a second example of the fifth embodiment.

Initially, in the present example, it is assumed that the aperture pattern of the shielding mask 300 is a pattern shown in FIG. 17A. The aperture pattern includes two apertures positioned on both sides of the aperture center of the aperture, and these two apertures have different shapes. Hereinafter, an angle around the aperture center of the shielding mask 300 is represented as "θ", and a distance from the aperture center is represented as "r" (the same is true of other examples).

In the present example, the aperture center of the shielding mask 300 and the rotation axis of the substrate 104 are matched to each other, and the rotation velocity of the substrate 104 is a non-uniform velocity. This is because the film thickness distribution (=tilt distribution) of the present example is different from the film thickness distribution of the first example, and is an odd function of θ. If the rotation velocity of the substrate 104 is the non-uniform velocity, it is possible to cause a difference between film thicknesses of two points having r on the surface of the substrate 104 in common and different θs.

Figure 17B:
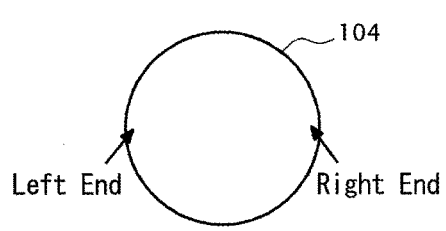

For example, if the rotation velocity of the substrate 104 is the non-uniform velocity, the rotation velocity becomes fast when the left end of the substrate 104 passes through the right aperture of FIG. 17A as shown in FIG. 17B and the rotation velocity becomes slow when the right end of the substrate 104 passes through the right aperture of FIG. 17A, the film thickness of the left end of the substrate 104 can be decreased, and the film thickness of the right end of the substrate 104 can be increased.

Figure 17C:
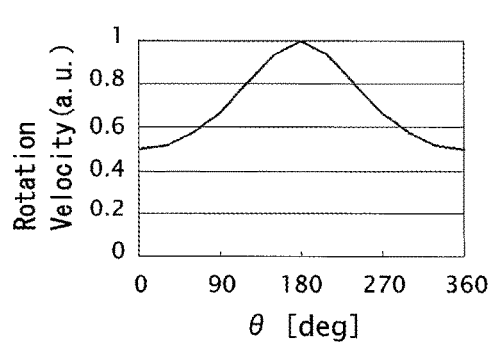

Thus, in the present embodiment, the rotation velocity of the substrate 104 is controlled as shown in FIG. 17C. That is, the rotation velocity of the substrate 104 is controlled to be a velocity corresponding to $1/\cos\theta$. This is because it is necessary to set a period for which the substrate 104 is released by the aperture to a period corresponding to $\cos\theta$ since the tilt distribution is expressed by $\cos\theta$. The period for which the substrate 104 is released by the aperture is a reciprocal number of the rotation velocity of the substrate 104.

Figure 17D:
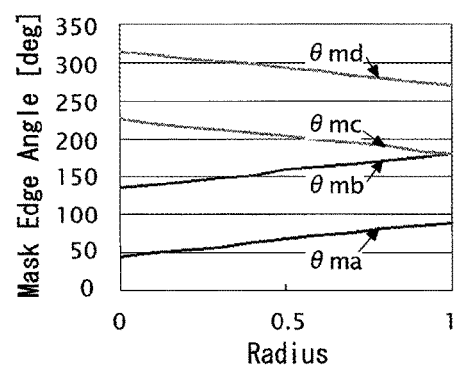

In the present embodiment, the aperture shape of the shielding mask 300 is set as shown in FIG. 17D. That is, the edge angle of each of the two apertures is set to be a linear function of r. This is because since the tilt distribution is expressed by the linear function of r in a specific direction of the substrate 104, the total edge angle of the two apertures of the shielding mask 300 may be the linear function of r in order to create such a tilt distribution, and the edge angle of each of the two apertures may be the linear function of r in order to set the total edge angle of the two apertures to be the linear function of r.

Figure 18A:
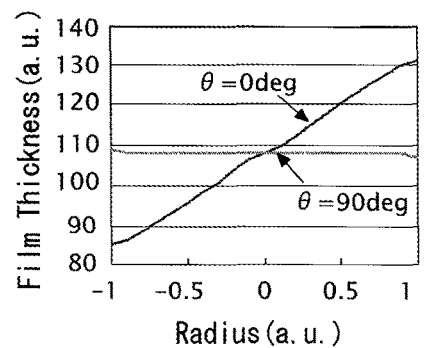
FIGS. 18A and 18B represent a second diagram for describing the second example of the fifth embodiment.
Figure 18B:
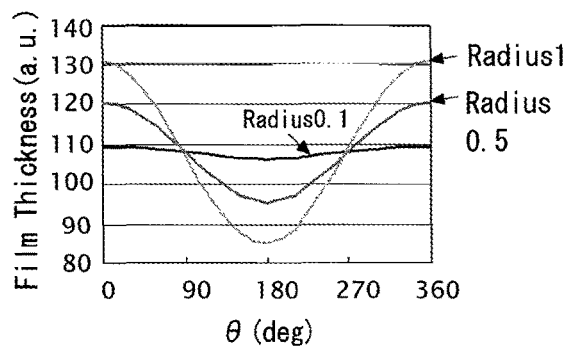

FIG. 18 is a simulation result of the present example. FIG. 18A shows that a film thickness distribution in a r direction is represented for each θ. It can be seen from FIG. 18A that the film thickness distribution of the present example is inclined in the direction of θ=0 degrees. FIG. 18B shows that a film thickness distribution in a θ direction is represented for each r, and the film thickness distribution is expressed by $\cos\theta$.

Figure 19A:
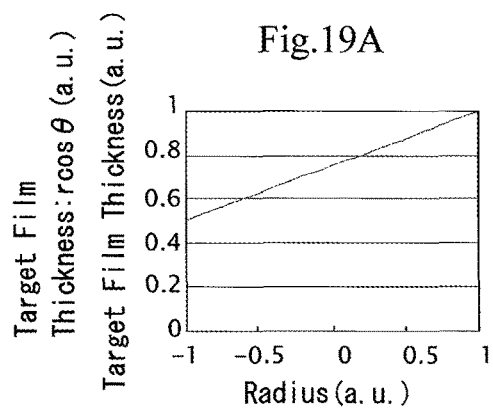
FIGS. 19A and 19B represent a third diagram for describing the second example of the fifth embodiment.
Figure 19B:
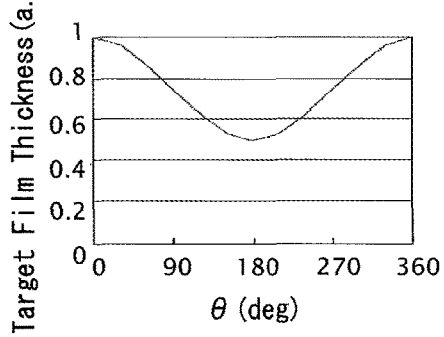

FIG. 19 shows a target film thickness distribution of a simulation. FIG. 19A shows the film thickness distribution in the r direction, and FIG. 19B shows the film thickness distribution in the θ direction. The film thickness values of FIGS. 19A and 19B are values normalized by the maximum film thickness.

In the present example, the film thickness distribution of the layer formed on the substrate 104 is influenced by causes other than the aperture pattern of the rotation velocity of the substrate 104 and the shielding mask 300. For example, there is an influence such as a curvature of the surface of the substrate 104 or a spatial distribution of sputter particles scattered from the target 106. These influences will be described below, but in the simulation of the present example, it is assumed that the surface of the substrate 104 is a planar surface, and it is assumed that the sputter particles are uniformly present (scattered).

Third Example of Fifth Embodiment

FIGS. 20, 21 and 22 are diagrams for describing a third example of the fifth embodiment. Hereinafter, a difference from the second example will be described.

In the present example, it is assumed that the film thickness distribution of the layer formed on the substrate 104 has a coma distribution. If the film thickness distribution has, for example, the surface shape, the "coma distribution" corresponds to a coma component.

Figure 20A:
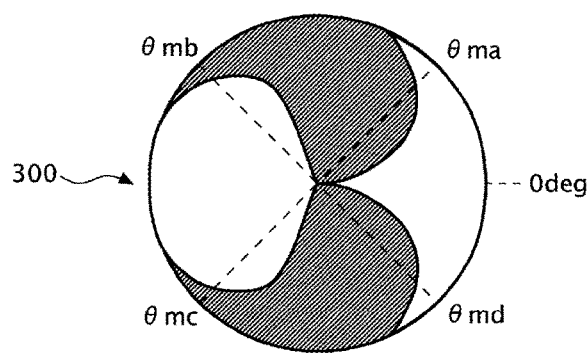
FIGS. 20A, 20B and 20C represent a first diagram for describing a third example of the fifth embodiment.
Figure 20B:
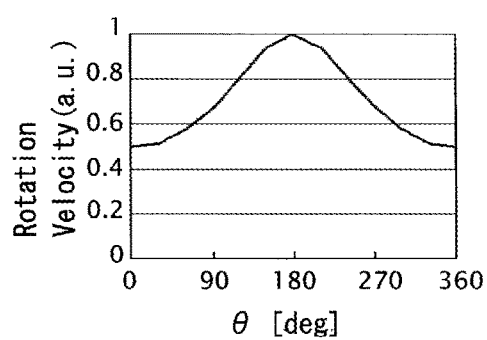

The rotation velocity of the substrate 104 of the present example is set as shown in FIG. 20B. That is, similarly to the second example, the rotation velocity of the substrate 104 of the present example is set to be velocity corresponding to $1/\cos\theta$.

Figure 20C:
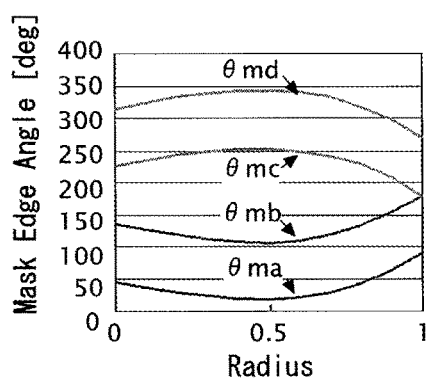

Meanwhile, the aperture shape of the shielding mask 300 of the present example is set as shown in FIGS. 20A and 20C. That is, the edge angle of the aperture of the shielding mask 300 is set to be a cubic function of r. This is because the coma distribution is expressed by the cubic function of r (for example, $3r^3-2r$).

Figure 21A:
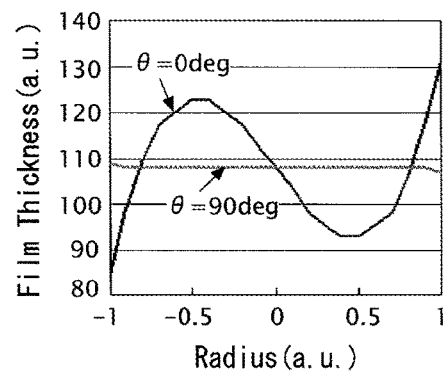
FIGS. 21A and 21B represent a second diagram for describing the third example of the fifth embodiment.
Figure 21B:
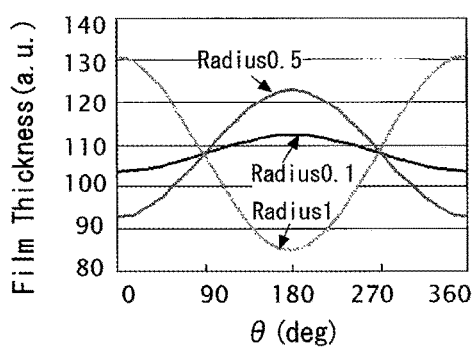

FIG. 21 shows a simulation result of the present example. FIG. 21A shows that the film thickness distribution in the r direction is represented for each $\theta$, and FIG. 21B shows that the film thickness distribution in the $\theta$ direction is represented for each r.

Figure 22A:
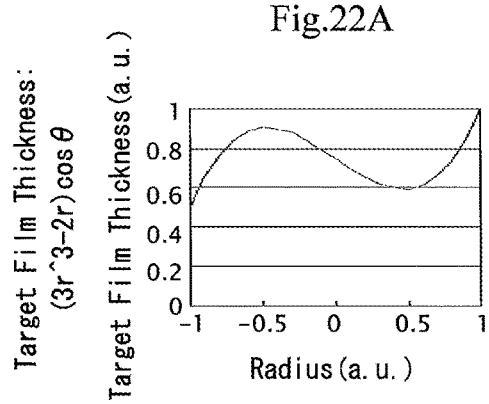
FIGS. 22A and 22B represent a third diagram for describing the third example of the fifth embodiment.
Figure 22B:
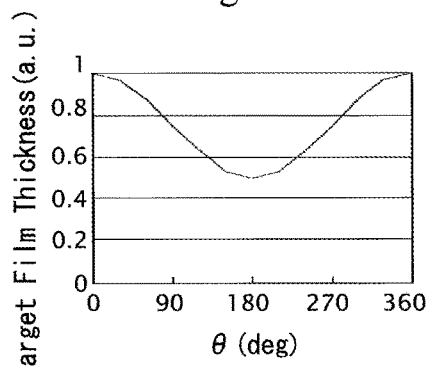

FIG. 22 is a target film thickness distribution of a simulation. FIG. 22A shows the film thickness distribution in the r direction, and FIG. 22B shows the film thickness distribution in the $\theta$ direction. The film thickness values in FIGS. 22A and 22B are values normalized by the maximum film thickness.

Fourth Example

FIGS. 23, 24 and 25 are diagrams for describing a fourth example of the fifth embodiment. Hereinafter, a difference from the third example will be described.

In the present example, it is assumed that the film thickness distribution of the layer formed on the substrate 104 has an astigmatism distribution. If the film thickness distribution has, for example, a surface shape, the "astigmatism distribution" corresponds to an astigmatism component.

Figure 23A:
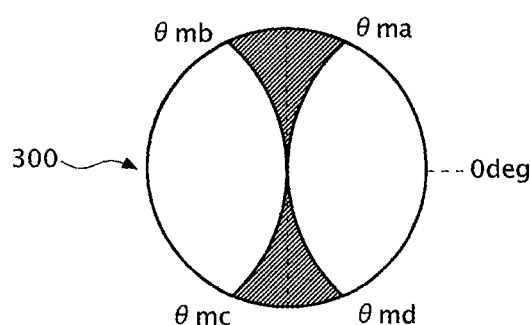
FIGS. 23A, 23B and 23C represent a first diagram for describing a fourth example of the fifth embodiment.
Figure 23B:
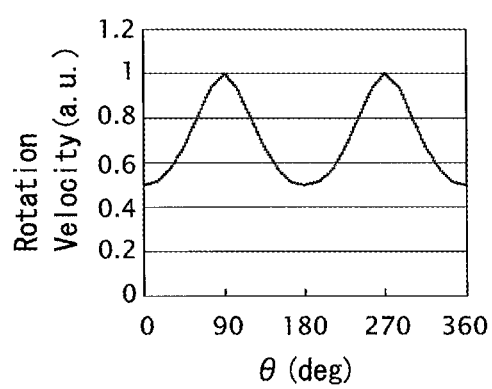

The rotation velocity of the substrate 104 of the present example is set to be a velocity corresponding to $1/\cos 2\theta$ as shown in FIG. 23B. This is because the astigmatism distribution is expressed by $\cos 2\theta$.

Figure 23C:
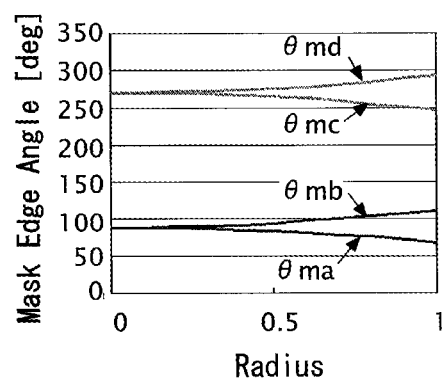

Meanwhile, the aperture shape of the shielding mask 300 of the present example is set as shown in FIGS. 23A and 23C. That is, the edge angle of the aperture of the shielding mask 300 is set to be a quadratic function of r. This is because the astigmatism distribution is expressed by the quadratic function of r.

Figure 24A:
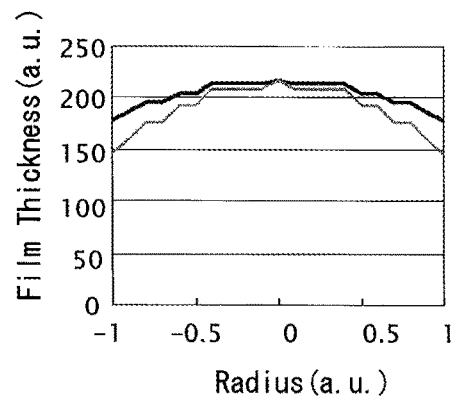
FIGS. 24A and 24B represent a second diagram for describing the fourth example of the fifth embodiment.
Figure 24B:
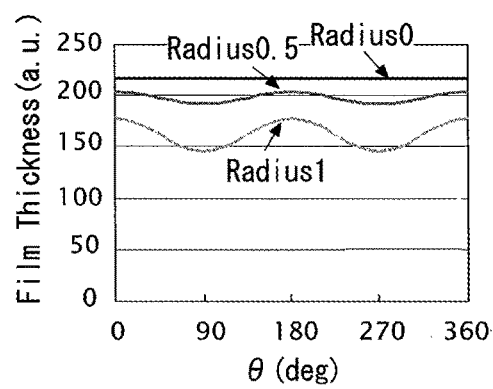

FIG. 24 shows a simulation result of the present example. FIG. 24(a) shows the film thickness distribution in the r direction, and FIG. 24(b) shows the film thickness distribution in the $\theta$ direction.

Figure 25A:
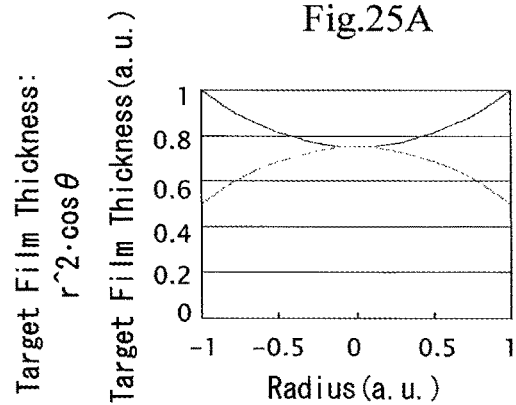
FIGS. 25A and 25B represent a third diagram for describing the fourth example of the fifth embodiment.
Figure 25B:
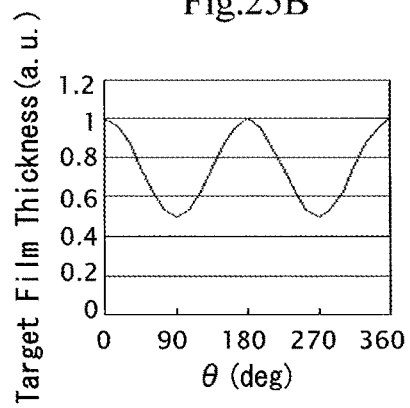

FIG. 25 shows a target film thickness distribution of a simulation. FIG. 25A shows the film thickness distribution in the r direction, and FIG. 25B shows the film thickness distribution in the $\theta$ direction. The film thickness values in FIGS. 25A and 25B are values normalized by the maximum film thickness.

The distribution of FIG. 24(a) and the distribution of FIG. 25A seems different at first glance. This is because the amount of curvature components is different between these distributions. If a process in which the curvature of the substrate 104 is offset is previously performed, these distributions are matched.

Fifth Example of Fifth Embodiment

FIGS. 26, 27 and 28 are diagrams for describing a fifth example of the fifth embodiment. Hereinafter, a difference from the fourth example will be described.

In the present example, it is assumed that the film thickness distribution of the layer formed on the substrate 104 has a zero $\theta$ distribution. If the film thickness distribution has, for example, a surface shape, the "zero $\theta$ distribution" corresponds to a zero $\theta$ component.

The layer having the zero $\theta$ distribution may be deposited by the film deposition method of the related art. However, in the present example, the film deposition method corresponding to the film deposition methods of the second example to the fourth example is performed.

Figure 26A:
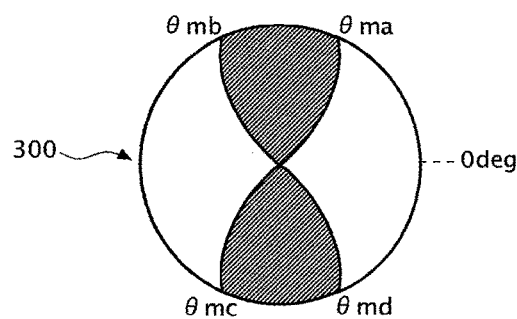
FIGS. 26A, 26B and 26C represent a first diagram for describing the fifth example of the fifth embodiment.
Figure 26B:
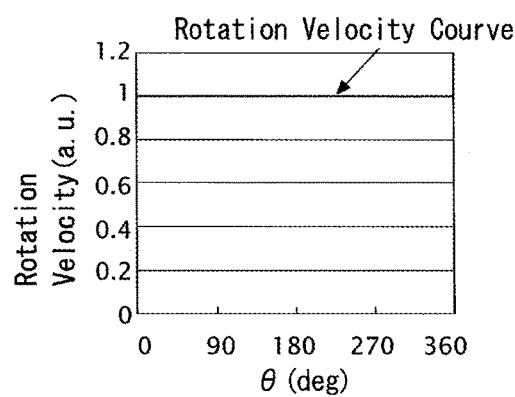

Initially, the rotation velocity of the substrate 104 of the present example is set as shown in FIG. 26B.

Figure 26C:
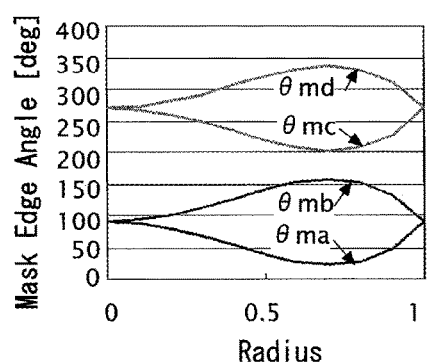

Meanwhile, the aperture shape of the shielding mask 300 of the present example is set as shown in FIGS. 26A and 26C.

Figure 27A:
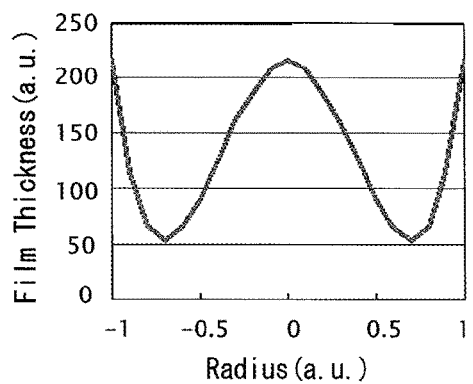
FIGS. 27A and 27B represent a second diagram for describing the fifth example of the fifth embodiment.
Figure 27B:
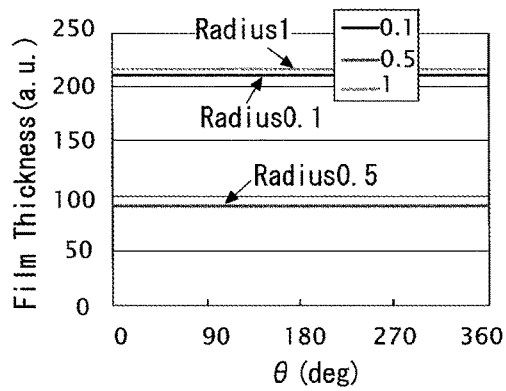

FIG. 27 is a simulation result of the present example. FIG. 27A shows that the film thickness distribution in the r direction is represented for each $\theta$, and FIG. 27B shows that the film thickness distribution in the $\theta$ direction is represented for each r.

Figure 28A:
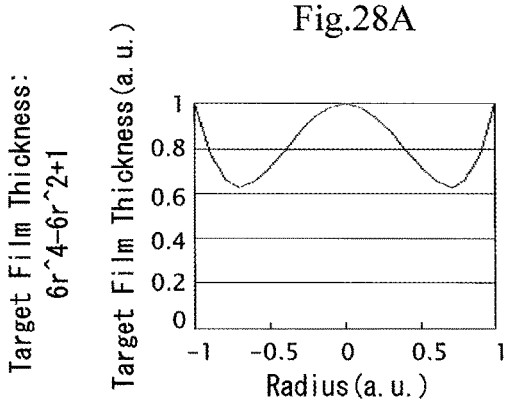
FIGS. 28A and 28B represent a third diagram for describing the fifth example of the fifth embodiment.
Figure 28B:
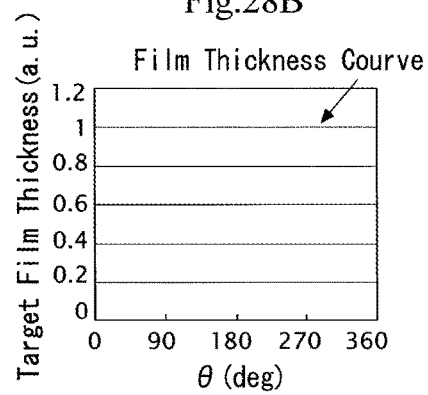

FIG. 28 is a target film thickness distribution of a simulation. FIG. 28A shows the film thickness distribution in the r direction, and FIG. 28B shows the film thickness distribution in the $\theta$ direction. The film thickness values in FIGS. 28A and 28B are values normalized by the maximum film thickness.

As stated above, in the first example to the fifth example of the fifth embodiment, five film deposition methods for realizing the "off-axis rotational symmetry distribution", the "tilt distribution", the "coma distribution", the "astigmatism distribution" and the "zero $\theta$ distribution" which are components having different film thickness distributions have been described. The "off-axis rotational symmetry distribution", the "tilt distribution", the "coma distribution", the "astigmatism distribution" and the "zero $\theta$ distribution" have the orthogonality relation therebetween, and are main components for stating a film thickness distribution of a layer formed on the surface of an optical element. That is, the "off-axis rotational symmetry distribution", the "tilt distribution", the "coma distribution", the "astigmatism distribution" and the "zero $\theta$ distribution" have a small number of components, but many film thickness distributions required for the optical element may be stated.

Accordingly, if any combination of the five film deposition methods of the fifth embodiment is performed, the layer having various film thickness distributions required for the optical element can be deposited on the substrate 104.

The five film deposition methods of the fifth embodiment may be performed using the common film deposition apparatus. If a mechanism for switching among five shielding masks is provided in the film deposition apparatus, the five film deposition methods may be performed in an arbitrary sequence.

It is needless to say that when the target film thickness distribution of the layer to be formed on the substrate 104 is simple, a layer required by only a part of the five film deposition methods may be deposited on the substrate 104.

For example, when the target film thickness distribution of a certain layer is expressed by the linear sum of the astigmatism distribution and the coma distribution, a part of the layer may be formed by the film deposition method of the fourth example, and the other part of the layer may be formed by the film deposition method of the third example.

The film thickness distribution generated in the film deposition apparatus is influenced by the shape of the substrate 104 or the spatial distribution of the sputter particles. At least one film deposition method of the fifth embodiment is applicable to the film deposition of a correction layer for correcting such an influence.

In the multilayer film used with the EUV light, each layer has an extremely thin film thickness such as several nm, and the total number of layers is about 100 layers. If the multilayer film is deposited by the film deposition method of the fifth embodiment, there are concern that a film deposition process is complicated and a film deposition time is long.

Thus, in the fifth embodiment, for example, in order to uniformize the spatial distribution of the sputter particles in the film deposition apparatus, it is preferable that the incident angle or the spatial distribution of ions applied to the target 106 or the surface shape of the target 106 are optimized.

If such optimization is applied to the film deposition method of the fifth embodiment, it is possible to deposit a layer having a unsymmetrical film thickness distribution with high accuracy.

It is preferable that a method of reducing this influence to the utmost is performed since the curvature of the surface of the substrate 104 becomes an error of the film thickness distribution. For example, if the target 106 is disposed near the central position of the curvature of the substrate 104, since the distance between the surface position of the substrate 104 and the target 106 becomes uniform, the film thickness distribution error hardly occurs.

In the fifth embodiment, it is important to simplify the film deposition process by expression the target film thickness distribution by a single low-order component (simple film thickness distribution) at a film design stage if possible.

Sixth Embodiment

Hereinafter, an embodiment of the film deposition apparatus will be described as a sixth embodiment of the present invention. The film deposition apparatus of the present embodiment is applicable to the manufacturing the multiplayer film reflector described in one of the first embodiment to the third embodiment.

Figure 29:
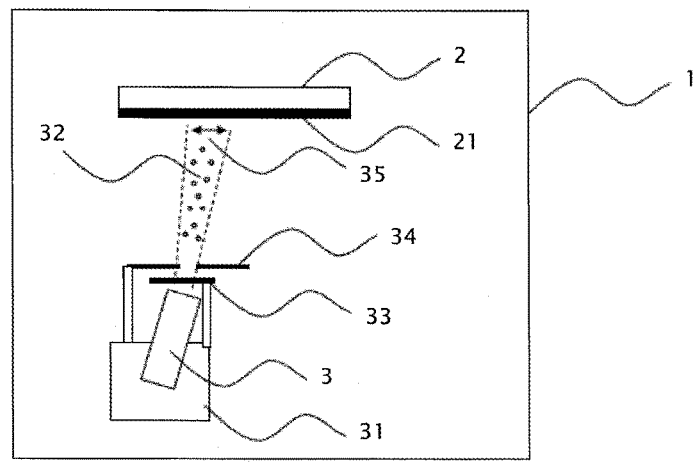
FIG. 29 is a configuration diagram of a film deposition apparatus of a sixth embodiment.

FIG. 29 is a configuration diagram of the film deposition apparatus of the present embodiment. As shown in FIG. 29, in the film deposition apparatus, a deposited object (substrate 2) and a sputter source (target and cathode) 3 are arranged so as to face each other within a film deposition chamber 1. A direction of the deposited surface 21 may be in vertical downward direction, an upward direction or a horizontal direction, but the sputter source 3 is disposed in a position where the deposited surface 21 can be faced.

The sputter source 3 may be held by, a 6-axis driving stage 31 capable of three-dimensionally facing an arbitrary direction and translating to an arbitrary position. The 6-axis driving stage 31 is a stage allowing for 3-axis translation and 3-axis rotation. If the requirement is satisfied, the number of axes of the driving stage 31 may be less than 6. A shutter 33 and a shielding mask 34 for adjusting the film deposition time are arranged in a direction in which the sputter particles 32 are released from the sputter source 3. Thus, if such a sputter source 3 is used, since it is possible to locally deposit the film in an arbitrary region on the deposited object 2, it is possible to freely control the film thickness distribution of the layer formed on the deposited surface 21.

The shape and size of the film deposition region 35 due to such a sputter source 3 can be freely changed using the shielding mask 34. The shielding mask 34 may be a variable mask capable of freely controlling the aperture such as a throttle of a camera.

If a small-sized sputter source is used as the sputter source 3, it is possible to restrict the film deposition region 35 irrespective of the presence or absence of the shielding mask 34. Alternatively, a plurality of small-sized sputter sources 3 is arranged to achieve multiple sputter sources, and the same advantages are obtained even though the output distributions of these sputter sources are controlled.

The sputter source 3 may be a sputter source of a magnetron sputtering type, a sputter source of an ion beam type, or an evaporation source. Even though any type of sputter source is used, the target of the sputter source 3 may be switched between a plurality of targets corresponding to the number of film deposition materials.

As mentioned above, the film deposition apparatus of the present embodiment can deposit a layer having a non-rotationally symmetrical film thickness distribution on the deposited object (substrate 2). Since it is possible to freely control the film thickness distribution of the layer, this film deposition apparatus is appropriately used to manufacture the multilayer film reflector of one of the first embodiment to the third embodiment.

Since the film deposition apparatus of the present embodiment directly scans the deposited object (substrate 2) with a relatively small-sized sputter source 3, it is possible to cope with a large-sized deposited object (substrate) 2.

According to the film deposition apparatus of the present embodiment, since the distance between the sputter source 3 and the deposited object (substrate 2) can be decreased, the film deposition rate is improved to lead a reduction in the total film deposition time of the multilayer film, and thus, it is possible to reduce an adverse effect of film oxidation which causes a reduction in the reflectivity.

Seventh Embodiment

Hereinafter, an embodiment of the film deposition apparatus will be described as a seventh embodiment of the present invention. The film deposition apparatus of the present embodiment is applicable to the manufacturing of the multilayer film reflector described in one of the first embodiment to the third embodiment.

Figure 30:
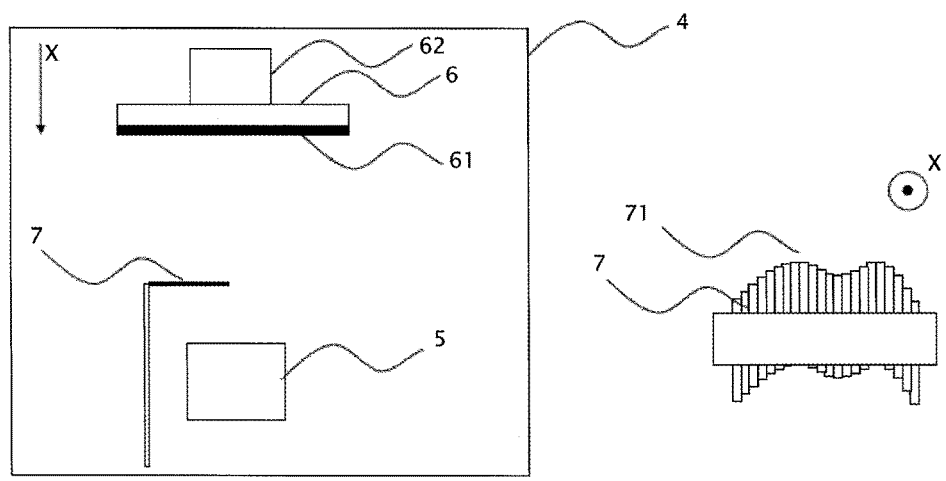
FIG. 30 is a configuration diagram of a film deposition apparatus of a seventh embodiment.

FIG. 30 is a configuration diagram of the film deposition apparatus of the present embodiment. A shown in FIG. 30, in the film deposition apparatus, a film deposition target 5 and a deposited object (substrate) 6 are arranged so as to face each other within a film deposition chamber 4. A direction of a deposited surface 61 may be a vertical downward direction, an upward direction or a horizontal direction, but the film deposition target 5 is disposed in a position where the deposited surface 61 can be faced.

The deposited object 6 is held by a rotation stage 62, and the rotation stage 62 rotates the deposited object 6 during the film deposition. By doing this, the unevenness of film thickness in the rotation direction of the deposited object 6 is guaranteed.

Here, in the film deposition apparatus of the present embodiment, a variable mask 7 is attached between the film deposition target 5 and the deposited object 6.

Accordingly, if the aperture shape of the variable mask 7 is controlled during the film deposition, it is possible to control the film thickness distribution of the layer deposited on the deposited object 6.

As shown on the right side of FIG. 30, the variable mask 7 is formed by arranging a plurality of mask elements 71 in a predetermined direction, and the shape of each element 71 is an elongated strip shape. Each of the plurality of mask elements 71 can be moved in a direction perpendicular to the predetermined direction. The configuration of the variable mask 7 is similar to the configuration of a tool such as a so-called molding gauge.

Accordingly, in the film deposition method using the aforementioned film deposition apparatus, it is possible to cause the film thickness distribution of the layer to approximate to the target film thickness distribution by performing the following adjustments during the process of depositing the layer on the deposited surface 61.

(1) After the layer is deposited on the deposited surface 61, the film thickness distribution of the layer is evaluated, and a new shape of the variable mask 7 capable of obtaining the target film thickness distribution is calculated.

(2) Positioning is performed on projection and recess portions of each of the plurality of mask elements 71 by a utilization method of the molding gauge such that the front end of the variable mask 7 has the new shape. Since the variable mask 7 does not include a driving mechanism such as a motor, it is possible to save a space within the film deposition apparatus. Since an electrical driving mechanism is not provided to control the variable mask 7, there is no concern about a malfunction.

In FIG. 30, only one film deposition target 5 is illustrated, as many film deposition targets as the number corresponding to the number of types of layers to be deposited are prepared. Thus, in the film deposition apparatus of the present embodiment, the same number of variable masks 7 as the number of film deposition targets 5 may be prepared. Accordingly, it is possible to arbitrarily control the film thickness distribution of each of the plurality of layers.

When a plurality of film deposition targets 5 and a plurality of variable masks 7 are used, an exchange mechanism is provided within a film deposition chamber 4.

As mentioned above, according to the film deposition apparatus of the present embodiment, it is possible to perform the film deposition at a high rate. The film deposition apparatus of the present embodiment exhibits both advantages of an advantage of the film thickness control using the fixed mask type and an advantage of the variable mask type. According to the film deposition apparatus of the present embodiment, it is possible to reduce the film deposition process and to adjust the film thickness distribution with high accuracy.

Eighth Embodiment

Hereinafter, an embodiment of the film deposition apparatus and a film deposition method using the same will be described as an eighth embodiment of the present invention. The film deposition apparatus and the film deposition method of the present embodiment are applicable to the manufacturing of the multilayer film reflector described in one of the first embodiment to the third embodiment. In the present embodiment, the layer having the non-rotationally symmetric film thickness distribution is deposited on the substrate.

Figure 31A:
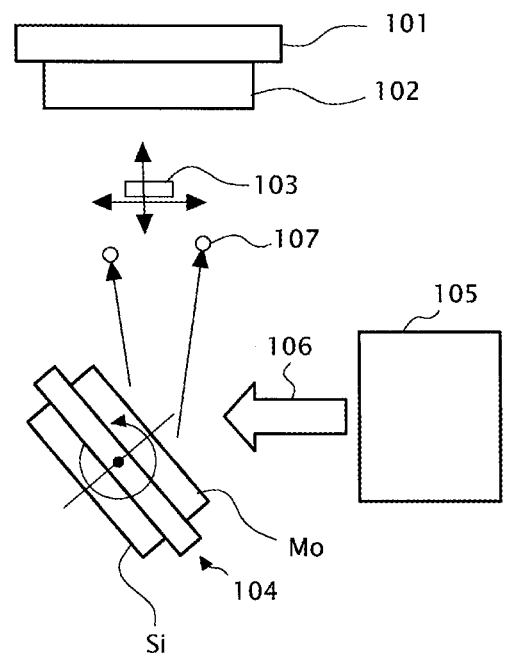
FIGS. 31A and 31B are diagrams for describing a film deposition apparatus and a film deposition method of an eighth embodiment.

FIG. 31 is a diagram for describing the film deposition apparatus of the present embodiment. As shown in FIG. 31A, in the film deposition apparatus of the present embodiment, a substrate 102 of a reflector provided in the projection optical system of the EUV exposure apparatus, a stage 101 that fixes the substrate 102, a target stage 104 to which a Mo target and a Si target are attached, an ion source 105 that extracts ion beams, and a shielding plate 103 having a function of correcting a film thickness are arranged within a vacuum vessel (not shown).

If the ion beams 106 extracted from the ion source 105 are applied to the Mo target, Mo atoms 107 are released from the Mo target by a sputtering phenomenon, and a Mo layer is formed on the surface of the substrate 102 by using the Mo atoms arriving at the surface.

If the target stage 104 is rotated by 180 degrees, the ion beams 106 extracted from the ion source 105 are applied to the Si target, and a Si layer is formed on the surface of the substrate 102.

If the Mo layer and the Si layer are repeatedly formed, the Mo/Si multilayer film is deposited on the surface of the substrate 102.

Here, in the film deposition apparatus of the related art in which the shielding plate 103 is not used, the film thickness distribution of the Mo layer and the film thickness distribution of the Si layer in the substrate 102 depend on the distribution of ion beams applied to the target, the positional relationship between the target and the substrate 102, and the surface shape of the substrate 102.

Thus, in the film deposition apparatus of the present embodiment, the film thickness distribution of the Mo layer and the film thickness distribution of the Si layer are controlled by disposing the shielding plate 103 between the target and the substrate 102 and moving the shielding plate 103 during the film deposition.

Figure 31B:
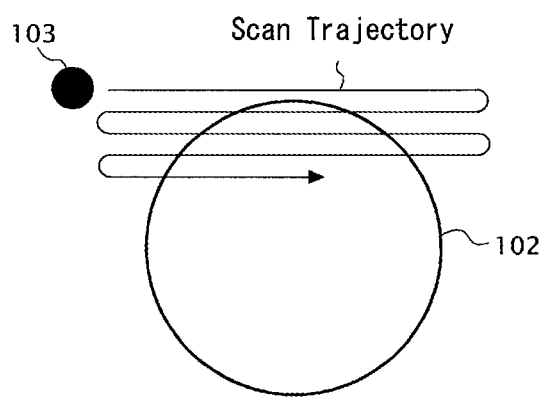

As shown in FIG. 31B, the shape of the shielding plate 103 is, for example, a disk shape, and a diameter of the disk is about $\frac{1}{10}$ of the diameter of the effective region of the substrate 102.

The shielding plate 103 is supported by a sufficiently thin wire (not shown), and can be moved by a non-shown driving unit through the wire. The movement direction of the shielding plate 103 is the X direction and Y direction perpendicular to each other within a surface perpendicular to a normal line or a rotationally symmetric axis of the surface of the substrate 102. The movement range of the shielding plate 103 covers the entire range which directly faces the effective region of the substrate 102.

As shown in FIG. 31B, the shielding plate 103 performs raster-scanning on the entire range which directly faces the effective region of the substrate 102 during the film deposition without intervals.

When the film deposition is performed by the aforementioned film deposition apparatus, the reduction amount of the film thickness can be set to be a known value by the shielding plate 103 by respectively evaluating the film thickness distribution of the layer deposited without using the shielding plate 103 and the film thickness distribution of the layer deposited using the uniform-velocity shielding plate 103 and comparing both the evaluation results.

By comparing the film thickness distribution of the layer deposited without using the shielding plate 103 with target film thickness distribution, it is possible to calculate how much thickness of which part of the layer is to be reduced (target reduction amount distribution).

By comparing the film thickness distribution of the layer deposited without using the shielding plate 103 with the film thickness distribution of the layer deposited using the uniform-velocity shielding plate 103, it is possible to set the reduction amount of the film thickness due to the uniform-velocity shielding plate 103 to be a known value.

Here, if the movement velocity of the shielding plate 103 becomes fast near a certain film deposition region, since a time to be shielded is decreased, the film thickness of the film deposition region becomes thick, and if the movement velocity becomes slow, the film thickness becomes thin.

Thus, when the film deposition is performed by the aforementioned film deposition apparatus, the optimum velocity pattern of the shielding plate 103 is calculated from the previously calculated target reduction amount distribution. At the time of the film deposition, the film thickness distribution of the layer is set to be a desired distribution by controlling the velocity pattern of the shielding plate 103 during the film deposition to be the calculated optimum velocity pattern.

As stated above, according to the film deposition apparatus of the present embodiment, it is possible to arbitrarily set the film thickness distribution of the layer by appropriately set the velocity pattern of the shielding plate 103.

It has been described that the number of shielding plates 103 is 1, but the film thickness distribution of the layer may be controlled by using a plurality of shielding plates 103 and individually moving each of the plurality of shielding plates 103 during the film deposition.

When the plurality of shielding plates 103 is simultaneously moved, it is preferable that a predetermined interval is formed between these shielding plates 103 such that regions which are part of the layer being deposited and are simultaneously influenced by the plurality of shielding plates 103 do not overlap with each other.

Although it has been described that the shape of the shielding plate 103 is the disk shape and the diameter of the disk is about 1/10 of the diameter of the effective region of the substrate 102, the combination of the shape and size of the shielding plate 103 is not limited thereto.

Ninth Embodiment

Hereinafter, an embodiment of the film deposition apparatus will be described as a ninth embodiment of the present invention. The film deposition apparatus of the present embodiment is applicable to the manufacturing of the multilayer film reflector described in one of the first embodiment to the third embodiment.

Figure 32A:
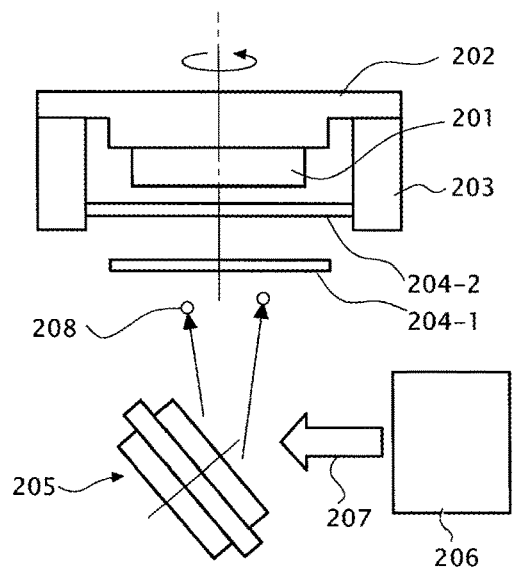
FIGS. 32A, 32B and 32C are diagrams for describing a film deposition apparatus of a ninth embodiment.

FIG. 32 is a diagram for describing the film deposition apparatus of the present embodiment. As shown in FIG. 32A, in the film deposition apparatus of the present embodiment, a substrate 201 of the reflector provided in the projection optical system of the EUV exposure apparatus, a stage 202 that fixes the substrate 201, a target stage 205 to which a Mo target and a Si target are attached, an ion source 206 that extracts ion beams, and shielding plates 204-1 and 204-2 having a function of correcting the film thickness are arranged within a vacuum vessel (not shown).

If the ion beams 207 extracted from the ion source 206 are applied to the Mo target, Mo atoms 208 are released from the Mo target by a sputtering phenomenon, and a Mo layer is formed on the surface of the substrate 201 by using the Mo atoms arriving at the surface.

If the target stage 205 is rotated by 180 degrees, the ion beams 207 extracted from the ion source 206 are applied to the Si target, and a Si layer is formed on the surface of the substrate 201.

If the Mo layer and the Si layer are repeatedly formed, the Mo/Si multilayer film is deposited on the surface of the substrate 201.

In the film deposition apparatus of the present embodiment, the substrate stage 202 rotates the substrate 201 around a predetermined rotation axis during the film deposition.

Here, in the film deposition apparatus of the related art in which the shielding plates 204-1 and 204-2 are not used, the film thickness distribution of the Mo layer and the film thickness distribution of the Si layer on the surface of the substrate 201 depend on the condition of ion beams applied to the target, the positional relationship between the target and the substrate 201, and the surface shape of the substrate 201.

Thus, in the film deposition apparatus of the present embodiment, the film thickness distribution of the Mo layer and the film thickness distribution of the Si layer are controlled by sequentially arranging two shielding plates 204-1 and 204-2 between the target and the substrate 201.

Initially, the shielding plate 204-1 arranged on the target side is fixed within the film deposition apparatus, and the shielding plate 204-1 does not rotate even though the substrate 201 rotates.

Figure 32B:
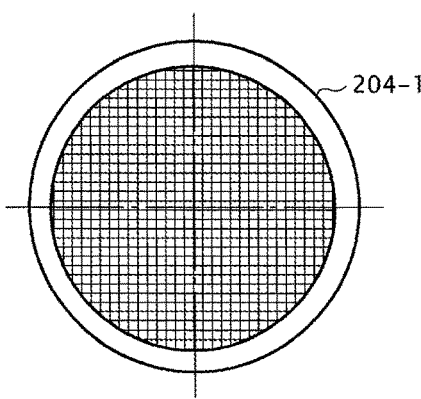

As shown in FIG. 32B, the basic structure of the shielding plate 204-1 is a structure in which beams each having a width of 0.5 mm are arranged on the entire surface of the region which directly faces the substrate 201 in a mesh shape with an interval of 4 mm lengthwise and crosswise.

An aperture ratio distribution (determined by a beam width distribution) of the shielding plate 204-1 is set to be a distribution for achieving the uniform film thickness distribution of the layer formed on the surface of the substrate 201. Since the substrate 201 rotates during the film deposition, an aperture ratio in the circumferential direction of the rotation axis is uniform, and an aperture ratio in the radial direction of the rotation axis is different depending on a distance from the rotation axis.

Meanwhile, the shielding plate 204-2 arranged on the substrate side is fixed to the substrate stage 202 with a shielding plate stage 203 therebetween, and rotates with the substrate 201.

Figure 32C:
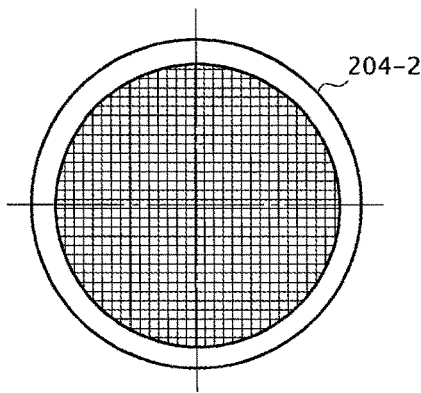

As shown in FIG. 32C, the basic structure of the shielding plate 204-2 is a structure in which beams each having a width of 0.5 mm are arranged on the entire surface of the region which directly faces the substrate 201 in a mesh shape with an interval of 4 mm lengthwise and crosswise.

An aperture ratio distribution (determined by a beam width distribution) of the shielding plate 204-2 is set to be a distribution corresponding to the target film thickness distribution of the layer to be deposited on the substrate 201. Since the shielding plate 204-2 rotates with the substrate 201, the film thickness distribution of the layer to be deposited can be set to be a rotationally symmetrical distribution or a non-rotationally symmetrical distribution.

In the film deposition apparatus of the present embodiment, it is preferable that the shielding plate stage 203 vibrates the shielding plate 204-2 during the film deposition.

The stroke of the vibration is about a half of the mesh interval of the shielding plate 204-2. Thus, it is possible to prevent the shadow of the mesh beam from being reflected in the substrate 201. Of course, when the influence of the shadow of the beam is sufficiently less, the vibration may be omitted.

It is preferable that a mechanism which temporarily retreats the shielding plate 204-1 from the position between the target and the substrate 201 to another position during the film deposition is provided in the film deposition apparatus of the present embodiment. If the film deposition is continued for a long period of time, there may be a problem that the target is sharpened by the application of the ion beams and the distribution is changed. However, if the shielding plate 204-1 is inserted or detached by this mechanism, it is possible to minimize the distribution change.

It is needless to say that a plurality of shielding plates may be provided in the film deposition apparatus of the present embodiment and these shielding plates may be changeably used.

It has been described that the basic structures of the shielding plates 204-1 and 204-2 of the present embodiment have the structure in which the beams each having a width of 0.5 mm are arranged on the entire surface of the region which directly faces the substrate 201 in the mesh shape with an interval of 4 mm lengthwise and crosswise, but the present embodiment is not limited thereto. As long as the film thickness on the substrate can be controlled with a desired accuracy, another basic structure may be used.

It is needless to say that in the film deposition apparatus of the present embodiment, the basic structures of the shielding plates 204-1 and 204-2 may be common or may not be common.

Tenth Embodiment

Hereinafter, an embodiment of the exposure apparatus will be described as a tenth embodiment of the present invention. One of the aforementioned multilayer film reflector is applied to at least one mirror of the following projection optical system.

Figure 33:
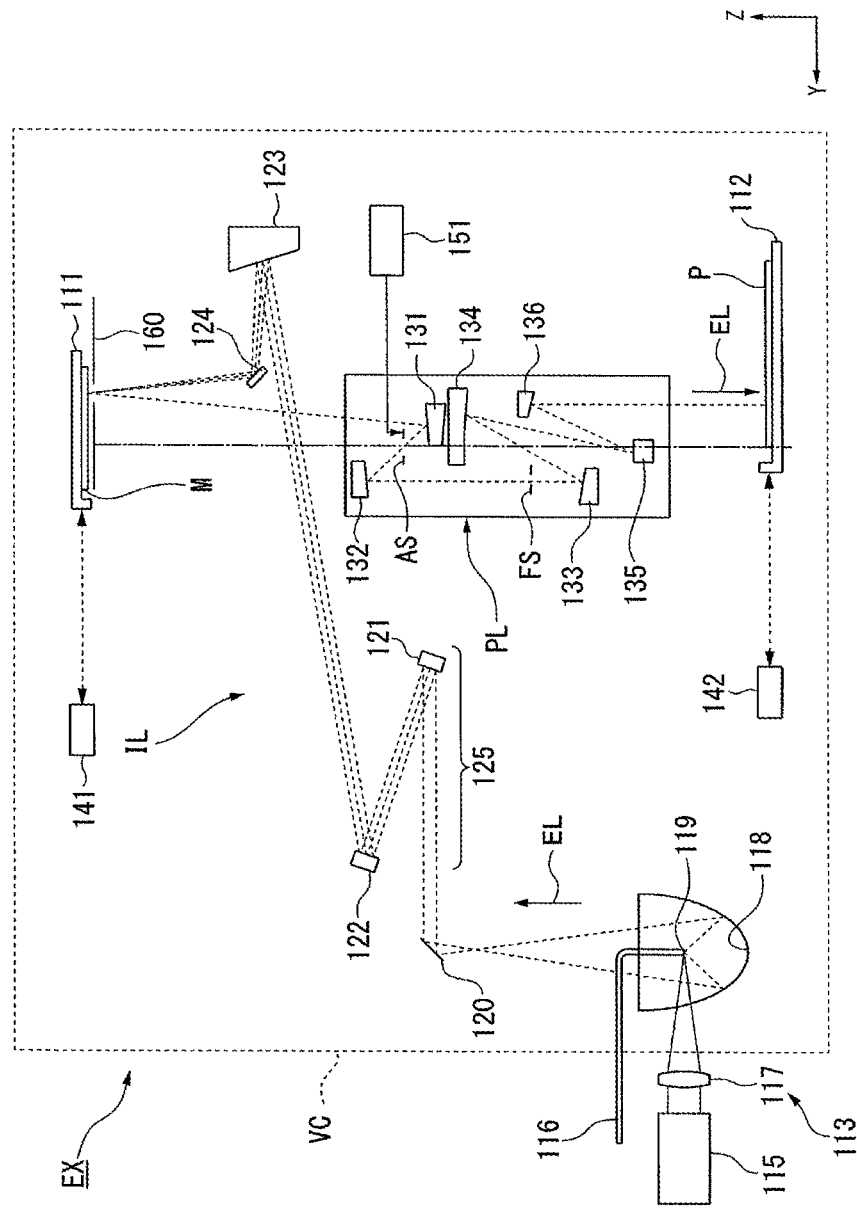
FIG. 33 is a configuration diagram of an exposure apparatus according to a tenth embodiment.

FIG. 33 is a diagram showing an example of an exposure apparatus EX according to the present embodiment. The exposure apparatus EX of the present embodiment is the EUV exposure apparatus that exposes the substrate P with the EUV light.

In FIG. 33, the exposure apparatus EX includes a mask stage 111 that can move while holding a mask M, a substrate stage 112 that can move while holding the substrate P to which exposure light EL is applied, a light source device 113 that generates the light (exposure light) EL including the EUV light, an illumination light optical system IL that illuminates the mask M held by the mask stage 111 with the exposure light EL emitted from the light source device 113, a projection optical system PL that projects an image of a pattern of the mask M illuminated with the exposure light EL, and a chamber device VC that has a predetermined space through which at least the exposure light EL passes and a vacuum system which causes the predetermined space to be in a vacuum state (for example, $1.3 \times 10^{-3}$ Pa or less).

The substrate P includes a substrate in which a photosensitive film is formed on a base such as a semiconductor wafer. The mask M includes a reticle in which a device pattern projected on the substrate P is formed. In the present embodiment, the EUV light is used as the exposure light EL and the mask M is a reflective mask having the multilayer film capable of reflecting the EUV light. The multilayer film of the reflective mask includes, for example, a Mo/Si multilayer film or a Mo/Be multilayer film. The exposure apparatus EX illuminates a reflection surface (pattern forming surface) of the mask M on which the multilayer film is formed with the exposure light EL, and exposes the substrate P with the reflection light of the exposure light EL reflected from the mask M.

The light source device 113 of the present embodiment is a laser excitation type plasma light source device, and includes a laser device 115 that emits laser beams, and a supply member 116 that supplies a target material such as xenon gas. The laser device 115 generates laser beams having a wavelength of an infrared region and visible region. For example, the laser device 115 includes a YAG laser due to the semiconductor laser excitation, an excimer laser, and a carbon dioxide laser.

The light source device 113 includes a first condensing optical system 117 that concentrates the laser beams emitted from the laser device 115. The first condensing optical system 117 concentrates the laser beams emitted from the laser device 115 into a position 119. The supply member 116 includes a supply opening for supplying the target material to the position 119. The laser beams concentrated by the first condensing optical system 117 are applied to the target material supplied from the supply member 116. The target material to which the laser beams are applied is heated to be a high temperature by the energy of the laser beams, is excited in a plasma state, and the light including the EUV light is generated when the state is changed to a low potential state. The light source device 113 may be a discharge plasma light source device.

The light source device 113 generates the light (EUV light) having a spectrum of an extreme ultraviolet region. The exposure apparatus EX includes a second condensing mirror 118 disposed near the position 119. The second condensing mirror 118 includes an elliptical mirror. The second condensing mirror 118 including the elliptical mirror is disposed such that a first focal point and the position 119 are substantially matched to each other.

The EUV light (exposure light) EL concentrated into a second focal point by the second condensing mirror 118 is supplied to the illumination optical system IL. The illumination optical system IL includes a plurality of optical elements 120, 121, 122, 123 and 124 to which the exposure light EL from the light source device 113 is supplied, and illuminates the mask M with the exposure light EL from the light source device 113. At least one of the optical elements 120, 121, 122, 123 and 124 of the illumination optical system IL may be the above-described optical element 100.

The optical element 120 of the illumination optical system IL is a third condensing mirror that functions as a collimator mirror, and the exposure light EL from the second condensing mirror 118 is supplied to this optical element. The exposure light EL from the second condensing mirror 118 is guided to the third condensing mirror 120.

The third condensing mirror 120 includes a parabolic mirror. The third condensing mirror 120 is disposed such that the focal point thereof and the second focal point of the second condensing mirror 118 are substantially matched to each other.

The illumination optical system IL includes an optical integrator 125. In the present embodiment, the optical integrator 125 includes a reflective fly-eye mirror optical system. The optical integrator 125 includes an incident-side fly-eye mirror 121, and an emission-side fly-eye mirror 122. The third condensing mirror 120 supplies the exposure light EL to the incident-side fly-eye mirror 121 of the optical integrator 125 in a substantially collimated state.

For example, the incident-side fly-eye mirror 121 includes a plurality of unit mirrors (reflection element group) which is substantially similar to illumination fields arranged in parallel and has an arc-shaped reflection surface, as disclosed in U.S. Pat. No. 6,452,661. The incident-side fly-eye mirror 121 is disposed in a position optically conjugated with the reflection surface of the mask M and the surface of the substrate P or in a region near the position.

The emission-side fly-eye mirror 122 includes a plurality of unit mirrors (reflection element group) corresponding to the plurality of unit mirrors of the incident-side fly-eye mirror 121. The unit mirrors of the incident-side fly-eye mirror 122 have a rectangular shape, and are arranged in parallel. The emission-side fly-eye mirror 122 is arranged in a position optically conjugated with a pupil position of the projection optical system PL or in a region near the position.

The light collimated from the third condensing mirror 120 is incident on the incident-side fly-eye mirror 121, and thus, wavefronts are divided by the incident-side fly-eye mirror 121. The unit mirrors of the incident-side fly-eye mirror 121 concentrate the incident light, and form a plurality of focal points (light source images). The plurality of unit mirrors of the emission-side fly-eye mirror 122 is arranged in a region near the position where the plurality of focal points is formed. A plurality of focal points (secondary light source) corresponding to the number of unit mirrors of the emission-side fly-eye mirror 122 is formed on the emission surface of the emission-side fly-eye mirror 122 or in a region near the emission surface.

The illumination optical system IL includes a condenser mirror 123. The condenser mirror 123 is disposed such that the focal position of the condenser mirror 123 and the region near the position of the secondary light source formed by the optical integrator 125 are substantially matched to each other. The light from the secondary light source formed by the optical integrator 125 is reflected from the condenser mirror 123 and is concentrated, and is supplied to the mask M through an optical path bending mirror 124.

As stated above, the illumination optical system IL including the plurality of optical elements 120 to 124 uniformly illuminates the illumination region on the mask M with the exposure light EL emitted from the light source device 113. The exposure light EL which is applied from the illumination optical system IL and is reflected from the mask M is incident on the projection optical system PL.

In order to spatially divide the optical path of the light supplied to the mask M and the light which is reflected from the mask M and is incident on the projection optical system PL, the illumination optical system IL of the present embodiment is a non-telecentric system. The projection optical system PL is also a mask-side non-telecentric system.

The mask stage 111 is a 6-degree-of-freedom stage that can move in six directions of X-axis, Y-axis, Z-axis, θX, θY, and θZ directions while holding the mask M. In the present embodiment, the mask stage 111 holds the mask M such that the XY plane and the reflection surface of the mask M are substantially parallel. Positional information of the mask stage 111 (mask M) is measured by a laser interferometer 141. The laser interferometer 141 measures the positional information regarding the X-axis, Y-axis and θZ directions of the mask stage 111 by using a measurement mirror provided at the mask stage 111.

The surface positional information (positional information regarding Z-axis, θX and θY) of the surface of the mask M held by the mask stage 111 is detected by a non-shown focus and leveling detection system. The position of the mask M held by the mask stage 111 is controlled based on the measurement result of the laser interferometer 141 and the detection result of the focus and leveling detection system.

For example, as disclosed in JP-A-2004-356415, the exposure apparatus EX of the present embodiment includes a blind member 160 which is disposed in a position facing at least a part of the reflection surface of the mask M and restricts the illumination region of the exposure light EL on the reflection surface of the mask M. The blind member 160 includes an aperture through which the exposure light EL can pass, and defines the illumination region of the exposure light EL on the reflection surface of the mask M.

The projection optical system PL includes a plurality of optical elements 131, 132, 133, 134, 135 and 136 to which the exposure light EL from the mask M is supplied, and projects an image of the pattern of the mask M illuminated with the exposure light EL on the substrate P. At least one of the optical elements 131, 132, 133, 134, 135 and 136 of the projection optical system PL may be the above-described optical element 100.

The projection optical system PL includes a first mirror pair which includes a first reflection mirror 131 having a reflection surface of a recess-surface shape and a second reflection mirror 132 having a reflection surface of a recess-surface shape, a second mirror pair which includes a third reflection mirror 133 having a reflection surface of a predetermined shape and a fourth reflection mirror 134 having a reflection surface of a recess-surface shape, and a third mirror pair which includes a fifth reflection mirror 135 having a reflection surface of a projection-surface shape and a sixth reflection mirror 136 having a reflection surface of a recess-surface shape.

Among each mirror pair, the first reflection mirror 131, the third reflection mirror 133 and the fifth reflection mirror 135 are arranged such that the reflection surfaces face the object side (mask M side) of the projection optical system PL, and the second reflection mirror 132, the fourth reflection mirror 134 and the sixth reflection mirror 136 are arranged such that the reflection surfaces face the image side (substrate P side) of the projection optical system PL.

The exposure light EL from the mask M forms an intermediate image after being reflected from the first mirror pair in the order of the first reflection mirror 131 and the second reflection mirror 132. The light from the intermediate image is reflected from the second mirror pair in the order of the third reflection mirror 133 and the fourth reflection mirror 134. The light reflected from the second mirror pair is reflected from the third mirror pair in the order of the fifth reflection mirror 135 and the sixth reflection mirror 136, and is guided to the substrate P. A visual field throttle FS which restricts the projection region on the substrate P is disposed in a position where the intermediate image is formed.

An aperture throttle AS which restricts the number of apertures NA of the projection optical system PL is disposed between the first reflection mirror 131 and the second reflection mirror 132 of the first mirror pair. The aperture throttle AS includes an aperture of which the size (diameter) is varied. The size (diameter) of the aperture is controlled by an aperture throttle control unit 151.

The substrate stage 112 is a 6-degree-of-freedom stage that can move in six directions of X-axis, Y-axis, Z-axis, θX, θY, and θZ directions while holding the substrate P. In the present embodiment, the substrate stage 112 holds the substrate P such that the surface of the substrate P and the XY plane are substantially parallel. Positional information of the substrate stage 112 (substrate P) is measured by a laser interferometer 142. The laser interferometer 142 measures the positional information regarding the X-axis, Y-axis and θZ directions of the substrate stage 112 by using a measurement mirror provided at the substrate stage 112. The surface positional information (positional information regarding Z-axis, θX and θY) of the surface of the substrate P held by the substrate stage 112 is detected by a non-shown focus and leveling detection system. The position of the substrate P held by the substrate stage 112 is controlled based on the measurement result of the laser interferometer 142 and the detection result of the focus and leveling detection system.

When the substrate P is exposed, the illumination optical system IL is synchronized with the movement of the mask stage 111 holding the mask M in the Y-axis direction while illuminating a predetermined illumination region on the mask M with the exposure light EL, and the substrate stage 112 holding the substrate P is moved in the Y-axis direction. Thus, the image of the pattern of the mask M is projected on the substrate P through the projection optical system PL.

In the above-described exposure apparatus, the multilayer film reflector of one of the above-described embodiments is applied to at least one mirror of the projection optical system PL, for example, a mirror having the greatest incident angle of the light EL.

Accordingly, the transmissivity of the projection optical system PL is increased, and the performance (specifically, the throughput of the exposure apparatus EX) of the exposure apparatus EX is increased.

As the substrate P of the present embodiment, a glass substrate for a display device, a ceramic wafer for a thin-film magnetic head, or an original plate (synthetic quartz or silicon wafer) of the mask or reticle used in the exposure apparatus are applied in addition to the semiconductor wafer for manufacturing the semiconductor device.

As the exposure apparatus EX, a projection exposure apparatus (stepper) of a step and repeat type which collectively exposes the pattern of the mask M while the mask M and the substrate P are stopped and moves the substrate P sequentially in a stepwise manner may be applied in addition to a scanning exposure apparatus (scanning stepper) of a step and scan type which moves the substrate P and the mask M in synchronization with each other and scans and exposes the pattern of the mask M.

In the step and repeat type exposure, after a reduction image of a first pattern is transferred onto the substrate P by using the projection optical system while the first pattern and the substrate P are substantially stopped, a reduction image of a second pattern may be collectively exposed on the substrate P by being partially overlapped with the first pattern by using the projection optical system while the second pattern and the substrate P are substantially stopped (a collective exposure apparatus of a stitch type).

As the exposure apparatus of the stitch type, an exposure apparatus of a step and stitch type which transfers at least two patterns onto the substrate P by partially overlapping these patterns and sequentially moves the substrate P may be applied.

For example, as disclosed in U.S. Pat. No. 6,611,316, the present invention may be applied to an exposure apparatus which combines two patterns of the mask on the substrate through the projection optical system and doubly exposes one shot region on the substrate at the substantially same time through the scanning exposure once.

As disclosed in U.S. Pat. No. 6,341,007, U.S. Pat. No. 6,400,441, U.S. Pat. No. 6,549,269, U.S. Pat. No. 6,590,634, U.S. Pat. No. 6,208,407, and U.S. Pat. No. 6,262,796, the present invention may be applied to an exposure apparatus of a twin-stage type which includes a plurality of substrate stages.

For example, as disclosed in U.S. Pat. No. 6,897,963, the present invention may be applied to an exposure apparatus which includes a substrate stage holding a substrate, and a measurement stage provided with a reference member on which a reference mark is formed and/or various photoelectric sensors. The present invention may be applied to an exposure apparatus which includes a plurality of substrate stages and measurement stages.

The type of the exposure apparatus EX is not limited to the exposure apparatus for manufacturing the semiconductor device which exposes the semiconductor element pattern on the substrate P, but may be widely applied to an exposure apparatus for manufacturing a liquid crystal display device or a display, or an exposure apparatus for manufacturing a thin-film magnetic head, a charge-coupled device (CCD), a micromachine, MEMS, a DNA chip, or a reticle or a mask.

The exposure apparatus EX of the present embodiment is manufactured by assembling various sub-systems including various components included in the claims so as to maintain predetermined mechanical precision, electrical precision, and optical precision. In order to ensure various precisions, before and after the sub-systems are assembled, the adjustment for achieving the optical precision for various optical systems, the adjustment for achieving the mechanical precision for various mechanical systems, and the adjustment for achieving the electrical precision for various electrical systems are performed. The process of assembling various sub-systems to the exposure apparatus includes mechanical connections, interconnections of electrical circuits, and pipe connections of pneumatic circuits between various sub-systems. It is needless to say that there is a process of assembling individual sub-systems before the process of assembling the various sub-systems to the exposure apparatus is performed. When the process of assembling the various sub-systems to the exposure apparatus is ended, the general adjustment is performed, and various precisions of the entire exposure apparatus are ensured. It is preferable that the exposure apparatus is manufactured in a clean room in which a temperature and cleanliness are managed.

Eleventh Embodiment

Hereinafter, an embodiment of the method of manufacturing a device will be described as an eleventh embodiment of the present invention. Any exposure apparatus of the tenth embodiment is applied to the method of manufacturing the device of the present embodiment.

Figure 34:
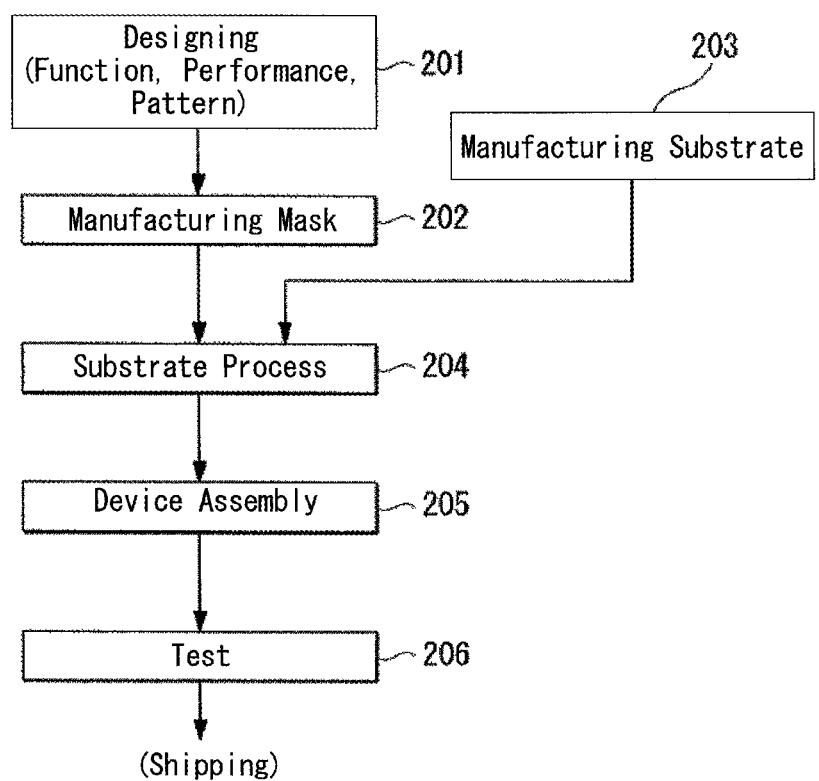
FIG. 34 is a flowchart of a method of manufacturing a device according to an eleventh embodiment.

As shown in FIG. 34, the device such as the semiconductor device is manufactured by performing step 201 of designing the function and performance of the device, step 202 of manufacturing the mask (reticle) based on the designing step, step 203 of manufacturing the substrate which is the base of the device, substrate process step 204 including a substrate process (an exposure process) including the exposure of the substrate P with the exposure light from the pattern of the mask and the development of the exposed substrate, device assembly step (including a processing process such as a dicing process, a bonding process, and a package process) 205, and test step 206.

In the present embodiment, any exposure apparatus of the tenth embodiment is used in the exposure process of exposing the substrate P. The exposure apparatus has high performance as described above. Therefore, according to the manufacturing method of the present embodiment, the device can be manufactured with high throughput.

A multilayer film reflector of any of the first embodiment to the third embodiment is a multilayer film reflector that includes a first uniform period multilayer film (substrate-side block), an adjustment layer (spacer layer), and a second uniform period multilayer film (anti-substrate-side block) in this order from a substrate (P) side. A combination of the following (a) to (c) is set to each region or each position within a reflection surface.

(a) Reflection characteristics of the single first uniform period multilayer film (substrate-side block)

(b) Reflection characteristics of the single second uniform period multilayer film (anti-substrate-side block)

(c) A film thickness of the adjustment layer (spacer layer)

Therefore, according to the multilayer film reflector of any of the first embodiment to the third embodiment, it is possible to give the reflection characteristics to each position or each region within the reflection surface with the simple film configuration.

The multilayer film reflector of any of the first embodiment to the third embodiment is appropriate for an optical system in which necessary reflection characteristics (for example, the angle range of the incident light to be reflected) are different for each position or each region within the reflection surface, for example, the projection optical system of the EUV exposure apparatus.

In the multilayer film reflector of any of the first embodiment to the third embodiment, a combination of the following parameters $\Gamma_1$, $d_1$, $N_1$, $\Gamma_2$, $d_2$, $N_2$ and $d_3$ is set to each region or each position within the reflection surface:

a ratio of film thickness $\Gamma_1$ of a layer pair of the first uniform period multilayer film, a cycle length $d_1$ of the layer pair of the first uniform period multilayer film, the number of laminations $N_1$ of the layer pair in the first uniform period multilayer film, a ratio of film thickness $\Gamma_2$ of a layer pair of the second uniform period multilayer film, a cycle length $d_2$ of the layer pair of the second uniform period multilayer film, the number of laminations $N_2$ of the layer pair in the second uniform period multilayer film, and a film thickness $d_3$ of the adjustment layer.

For example, at least two reflection points or reflection regions in which a combination of parameters $\Gamma_1$ and $d_3$ is different are present within the reflection surface of the multilayer film reflector of the first embodiment. Parameters other than $\Gamma_1$ and $d_3$ are uniform or are substantially uniform within the reflection surface.

For example, at least two reflection points or reflection regions in which a combination of parameters $N_1$ and $N_2$ is different are present within the reflection surface of the multilayer film reflector of the second embodiment. Parameters other than $N_1$ and $N_2$ are uniform within the reflection surface.

In the multilayer film reflector of any of the first embodiment to the third embodiment, a distribution of the combination within the reflection surface is set to be a smooth distribution.

Therefore, according to the multilayer film reflector of any of the first embodiment to the third embodiment, it is possible to suppress the number of design parameters at the time of design and the number of adjustment parameters at the time of film deposition. Since the basic film configuration is common between the positions within the reflection surface, it is possible to cause many film deposition processes to be common (see fourth embodiment to ninth embodiment).

In the multilayer film reflector of any of the first embodiment to the third embodiment, the adjustment layer is one of a spacer layer, a mixing layer and a thermal diffusion layer which have an extinction coefficient less than an extinction coefficient of a material having the highest extinction coefficient in a use wavelength, among materials of the first uniform period multilayer film.

In the multilayer film reflector of any of the first embodiment to the third embodiment, the adjustment layer is a spacer layer which is made of any one material of C, B, Zr, Nb, Ru, Mo and Si, or is a spacer layer which is formed from a mixture layer including at least one material of C, B, Zr, Nb, Ru, Mo and Si.

In the multilayer film reflector of any of the first embodiment to the third embodiment, the layer pairs of the first uniform period multilayer film or the second uniform period multilayer film is formed from a combination of a Mo layer and a Si layer, and the spacer layer is formed from a Mo layer or a Si layer.

Therefore, the multilayer film reflector of any of the first embodiment to the third embodiment does not need a special material with high performance and simple configuration.

A film deposition method of any of the fourth embodiment to the ninth embodiment is a method of manufacturing the multilayer film reflector of any of the first embodiment to the third embodiment. The manufacturing method includes: a releasing procedure of releasing particles as a material of any layer of the multilayer film reflector toward a film deposition region; a moving procedure of relatively moving the substrate of the multilayer film reflector and the film deposition region; and a controlling procedure of controlling a film thickness distribution of the layer formed on the substrate by controlling at least one of a size of the film deposition region in the movement direction and a velocity of the movement.

Therefore, according to the film deposition method of any of the fourth embodiment to the ninth embodiment, the layers in which the material is common and the film thickness distribution is non-uniform can be formed on the substrate.

A film deposition method of the fifth embodiment includes: a releasing procedure of releasing particles as a material of any layer of the multilayer film reflector toward the substrate of the multilayer film reflector; and a controlling procedure of controlling a film thickness distribution of the layer formed on the substrate by distinguishably using a plurality of masks having different aperture patterns as masks to be set in a path of the particles.

In the controlling procedure, the substrate is rotated around an axis during the releasing of the particles, and a rotation velocity of the substrate is controlled with a function of a rotation angle of the substrate.

In the film deposition method of the fifth embodiment, film thickness distributions of partial layers on which the plurality of masks is individually formed on the substrate have an orthogonality relation therebetween.

Therefore, according to the film deposition method of the fifth embodiment, it is possible to form the layers having various film thickness distributions on the substrate.

Therefore, the film deposition method of any of the fourth embodiment to the ninth embodiment is appropriately used to manufacture the multilayer film reflector of any of the first embodiment to the third embodiment.

A projection optical system of the tenth embodiment includes the multilayer film reflector of any of the embodiments.

Therefore, the projection optical system of the tenth embodiment has high performance.

An exposure apparatus of the tenth embodiment includes any of the aforementioned projection optical systems.

Therefore, the exposure apparatus of the tenth embodiment has high performance.

A method of manufacturing a device of the eleventh embodiment uses the above-described exposure apparatus.

Therefore, according to the method of manufacturing the device of the eleventh embodiment, the device can be manufactured with high throughput.

[Others]

The requirements of the above-described embodiments may be appropriately combined. Some components may not be used in some cases. Each disclosure of every Japanese unexamined patent application publication and United States patent related to the apparatus recited in each of the above-described embodiments and the modifications is hereby incorporated by reference in its entirety to the extent permitted by the national laws and regulations.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A multilayer film reflector comprising:
    at least one pair of a first uniform period multilayer film and an adjustment layer; and
    a second uniform period multilayer film,
    wherein a combination of a ratio of film thickness of a layer pair of the first uniform period multilayer film and a film thickness of the adjustment layer is different for each position within a reflection surface or for each region within the reflection surface.

2. The multilayer film reflector according to claim 1,
    wherein the adjustment layer is one of a spacer layer, a mixing layer and a thermal diffusion layer which have an extinction coefficient less than an extinction coefficient of a material having a highest extinction coefficient in a use wavelength, among materials of the first uniform period multilayer film.

3. The multilayer film reflector according to claim 1,
    wherein the adjustment layer is a spacer layer which is made of any one material of C, B, Zr, Nb, Ru, Mo and Si, or is a spacer layer which is formed from a mixture layer including at least one material of C, B, Zr, Nb, Ru, Mo and Si.

4. The multilayer film reflector according to claim 1,
    wherein the layer pairs of the first uniform period multilayer film or the second uniform period multilayer film is formed from a combination of a Mo layer and a Si layer, and
    the spacer layer is formed from one of a Mo layer and a Si layer.

5. A method of manufacturing the multilayer film reflector according to claim 1, the method comprising:
    releasing particles as a material of a layer of the multilayer film reflector toward a film deposition region;
    relatively moving the substrate of the multilayer film reflector and the film deposition region; and
    controlling a film thickness distribution of the layer formed on the substrate by controlling at least one of a size of the film deposition region in a relative movement direction and a velocity of the movement.

6. A method of manufacturing the multilayer film reflector according to claim 1, the method comprising:
    releasing particles as a material of a layer of the multilayer film reflector toward the substrate of the multilayer film reflector; and
    controlling a film thickness distribution of the layer formed on the substrate by distinguishably using a plurality of masks having different aperture patterns as masks to be set in a path of the particles.

7. The method of manufacturing the multilayer film reflector according to claim 6, the method further comprising:
    rotating the substrate around an axis during the releasing of the particles; and
    controlling a rotation velocity of the substrate with a function of a rotation angle of the substrate.

8. The method of manufacturing the multilayer film reflector according to claim 6,
    wherein film thickness distributions of partial layers on which the plurality of masks is individually formed on the substrate is formed of at least one of an off-axis rotational symmetry distribution, a tilt distribution, a coma distribution, an astigmatism distribution and a zero $\theta$ distribution.

9. A projection optical system comprising the multilayer film reflector according to claim 1.

10. An exposure apparatus comprising the projection optical system according to claim 9.

11. A method of manufacturing a device using the exposure apparatus according to claim 10.

12. A multilayer film reflector comprising:
    at least one pair of a first uniform period multilayer film and an adjustment layer; and
    a second uniform period multilayer film,
    wherein a combination of the number of laminations of a layer pair in the first uniform period multilayer film and the number of laminations of a layer pair in the second uniform period multilayer film is different for each position within a reflection surface or for each region within the reflection surface.

13. The multilayer film reflector according to claim 12,
    wherein the adjustment layer is one of a spacer layer, a mixing layer and a thermal diffusion layer which have an extinction coefficient less than an extinction coefficient of a material having a highest extinction coefficient in a use wavelength, among materials of the first uniform period multilayer film.

14. The multilayer film reflector according to claim 12,
    wherein the adjustment layer is a spacer layer which is made of any one material of C, B, Zr, Nb, Ru, Mo and Si, or is a spacer layer which is formed from a mixture layer including at least one material of C, B, Zr, Nb, Ru, Mo and Si.

15. The multilayer film reflector according to claim 12,
    wherein the layer pairs of the first uniform period multilayer film or the second uniform period multilayer film is formed from a combination of a Mo layer and a Si layer, and
    the spacer layer is formed from one of a Mo layer and a Si layer.

16. A method of manufacturing the multilayer film reflector according to claim 12, the method comprising:
releasing particles as a material of a layer of the multilayer film reflector toward a film deposition region;
relatively moving the substrate of the multilayer film reflector and the film deposition region; and
controlling a film thickness distribution of the layer formed on the substrate by controlling at least one of a size of the film deposition region in a relative movement direction and a velocity of the movement.

17. A method of manufacturing the multilayer film reflector according to claim 12, the method comprising:
releasing particles as a material of a layer of the multilayer film reflector toward the substrate of the multilayer film reflector; and
controlling a film thickness distribution of the layer formed on the substrate by distinguishably using a plurality of masks having different aperture patterns as masks to be set in a path of the particles.

18. The method of manufacturing the multilayer film reflector according to claim 17, the method further comprising:
rotating the substrate around an axis during the releasing of the particles; and
controlling a rotation velocity of the substrate with a function of a rotation angle of the substrate.

19. The method of manufacturing the multilayer film reflector according to claim 17,
wherein film thickness distributions of partial layers on which the plurality of masks is individually formed on the substrate is formed of at least one of an off-axis rotational symmetry distribution, a tilt distribution, a coma distribution, an astigmatism distribution and a zero θ distribution.

20. A projection optical system comprising the multilayer film reflector according to claim 12.

21. An exposure apparatus comprising the projection optical system according to claim 20.

22. A method of manufacturing a device using the exposure apparatus according to claim 21.

* * * * *